United States Patent
Tamura et al.

(10) Patent No.: US 8,950,999 B2
(45) Date of Patent: Feb. 10, 2015

(54) SUBSTRATE PROCESSING APPARATUS AND PARTICLE ADHESION PREVENTING METHOD

(75) Inventors: Akitake Tamura, Nirasaki (JP); Teruyuki Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1274 days.

(21) Appl. No.: 12/525,314

(22) PCT Filed: Jan. 31, 2008

(86) PCT No.: PCT/JP2008/051540
§ 371 (c)(1),
(2), (4) Date: Jul. 31, 2009

(87) PCT Pub. No.: WO2008/093787
PCT Pub. Date: Aug. 7, 2008

(65) Prior Publication Data
US 2010/0111648 A1 May 6, 2010

(30) Foreign Application Priority Data
Jan. 31, 2007 (JP) ................................. 2007-022449

(51) Int. Cl.
*H01L 21/677* (2006.01)
*H01L 21/67* (2006.01)

(52) U.S. Cl.
CPC .... *H01L 21/67772* (2013.01); *H01L 21/67248* (2013.01); *H01L 21/67766* (2013.01); *H01L 21/67778* (2013.01)
USPC ........................................................ 414/217

(58) Field of Classification Search
USPC .................... 414/217, 935, 937, 939; 432/86; 118/58, 728, 729
See application file for complete search history.

(56) References Cited

U.S. PATENT DOCUMENTS 6,010,637 A * 1/2000 Lee et al. ........................ 216/96
(Continued)

FOREIGN PATENT DOCUMENTS

| JP | 63 144537 | 6/1988 |
|---|---|---|
| JP | 3 94445 | 4/1991 |

(Continued)

*Primary Examiner* — Saul Rodriguez
*Assistant Examiner* — Willie Berry, Jr.
(74) *Attorney, Agent, or Firm* — Oblon, Spivak, McClelland, Maier & Neustadt, L.L.P.

(57) ABSTRACT

Any particle adhesion onto the surface of a substrate to be processed is prevented. There is provided a substrate processing apparatus characterized by including a transfer chamber for, via a gate to which a substrate accommodating container for accommodation of the substrate is set, performing transfer of the substrate between the same and the substrate accommodating container, a processing chamber for applying a specific process to the substrate, a load-lock chamber for linking the processing chamber with the transfer chamber, and a temperature control unit for at the stage of transferring the substrate into at least one of the transfer chamber and the load-lock chamber, so as for the temperature of the substrate just before the transfer thereof to be higher than the temperature of the interior of the chamber, into which the substrate will be transferred, controlling at least one of the temperature of the substrate and the temperature of the interior of the chamber.

15 Claims, 27 Drawing Sheets

(56) References Cited

U.S. PATENT DOCUMENTS

| | | |
|---|---|---|
| 6,177,661 B1 | 1/2001 | Lee et al. |
| 7,162,881 B2 | 1/2007 | Sogard |
| 2002/0106267 A1* | 8/2002 | Fujii et al. .................... 414/217 |
| 2004/0029300 A1 | 2/2004 | Iijima et al. |
| 2005/0236942 A1 | 10/2005 | Rival et al. |
| 2005/0252455 A1 | 11/2005 | Moriya et al. |

FOREIGN PATENT DOCUMENTS

| | | |
|---|---|---|
| JP | 10 163303 | 6/1998 |
| JP | 2002 237507 | 8/2002 |
| JP | 2005 303297 | 10/2005 |
| JP | 2005 311360 | 11/2005 |
| JP | 2005 354025 | 12/2005 |
| JP | 2006 147638 | 6/2006 |

* cited by examiner

FIG.5

| PARTICLE SIZE | NUMBER OF PARTICLES ON WAFER Wa(24°C) | NUMBER OF PARTICLES ON WAFER Wb(27°C) |
|---|---|---|
| 0.06~0.10μm | 16,431 | 374 |
| 0.10~0.20μm | 9,610 | 69 |
| 0.20~ μm | 3,999 | 453 |
| TOTAL | 30,040 | 896 |

FIG. 7

| PARTICLE SIZE | NUMBER OF PARTICLES ON WAFER Wc(24°C) | NUMBER OF PARTICLES ON WAFER Wd(35°C) |
|---|---|---|
| 0.06~0.10μm | 17,464 | 144 |
| 0.10~0.20μm | 5,903 | 139 |
| 0.20~ μm | 891 | 229 |
| TOTAL | 24,258 | 512 |

SUBSTRATE PROCESSING APPARATUS AND PARTICLE ADHESION PREVENTING METHOD

FIELD OF THE INVENTION

The present invention relates to a substrate processing apparatus and particle adhesion preventing method capable of preventing adhesion of particles to a surface of a substrate to be processed.

BACKGROUND OF THE INVENTION

A substrate processing apparatus is used to perform certain processes such as an etching process or a film forming process on a substrate to be processed such as a glass substrate (e.g., a liquid crystal substrate) or a semiconductor wafer (hereinafter, simply referred to as a "wafer"). The substrate processing apparatus includes, e.g., a processing unit containing a processing chamber for performing a certain process on a wafer, and a load-lock chamber connected to the processing chamber. The substrate processing apparatus further includes a cassette stage, on which a cassette container is placed, the cassette container accommodating an unprocessed wafer to be loaded into the apparatus or a processed wafer to be unloaded from the apparatus, a lid detachment mechanism for attaching/detaching a lid to/from the cassette container (see, e.g., Japanese Patent Laid-open Publication No. H10-125763), and a transfer chamber provided with a transfer mechanism, such as a transfer arm, to perform wafer delivery between the cassette container and the processing unit.

In the substrate processing apparatus, when the cassette container accommodating an unprocessed wafer is placed on the cassette stage, the lid is detached from the cassette container by using the lid detachment mechanism. Thereafter, the unprocessed wafer is unloaded from the cassette container by using the transfer mechanism provided in the transfer chamber, and then delivered to the processing unit. The unprocessed wafer is transferred to the processing chamber via the load-lock chamber. A certain process is carried out on the wafer in the processing chamber. The wafer completely processed in the processing chamber is returned from the processing chamber to the load-lock chamber. The transfer mechanism provided in the transfer chamber receives the processed wafer returned to the load-lock chamber, and transfers the processed wafer to the cassette container.

In the transfer chamber, transfer of an unprocessed wafer or a processed wafer is performed by using the transfer mechanism, as mentioned above. Accordingly, particles (e.g., dust, dirt, deposit, and reaction products) float in the transfer chamber due to operations carried out in the transfer chamber, e.g., wafer transferring operations. As a result, particles may be adhered to a surface of a wafer during transfer of the wafer. When a process is performed on the wafer with particles adhered, degradation in yield may occur. For example, in an etching process, the particles adhered to the surface of the wafer may function as a mask, thereby generating etching residues. Further, in a film forming process, the particles adhered to the surface of the wafer may function as nuclei, so that they may cause degradation in film quality due to growth thereof. Thus, generally, a nonreactive gas such as $N_2$ gas or clean air is supplied to the transfer chamber via a high efficiency particulate air (HEPA) filter or an ultra low penetration air (ULPA) filter.

However, it may be impossible to completely remove contaminants only by supplying, e.g., clean air to the transfer chamber via the HEPA filter or ULPA filter. For example, substances, which may remain floating in the transfer chamber without being completely removed, include molecules of a lubricant such as grease used in a driving system including the transfer mechanism and the lid detachment mechanism, water molecules, impure gas molecules such as ammonia, organic matter produced from line materials adhered to the processed wafer (see, e.g., Japanese Patent Laid-open Publication No. 2003-7799).

Accordingly, attempts have been continuously made to reduce the amount of contaminants in the transfer chamber by providing a chemical filter using activated carbon instead of the HEPA filter or ULPA filter, or to suppress the generation of particles in the transfer chamber through selection of parts or adjustment of devices.

Meanwhile, in the above-mentioned substrate processing apparatus, the wafer accommodated in the cassette container is transferred, for processing thereof, to the processing chamber via at least one chamber, that is, the transfer chamber or the load-lock chamber.

Further, in a so-called cluster tool type substrate processing apparatus including processing units, a plurality of processing chambers are connected to a common transfer chamber. The common transfer chamber is connected to the transfer chamber via a load-lock chamber. In such a substrate processing apparatus, the wafer accommodated in the cassette container is transferred, for processing thereof, to the processing chamber via, e.g., the above-mentioned transfer chamber, the load-lock chamber and the common transfer chamber.

Thus, the wafer may be affected by particles not only in the transfer chamber, but also in other chambers, until it is processed after being transferred from the cassette container to the processing chamber. Accordingly, various techniques have been proposed to prevent generation of particles in each chamber. For example, Japanese Patent Laid-open Publication No. H9-82781 discloses a technique for preventing reaction by-products from being adhered to respective inner walls of a reaction chamber (processing chamber) and a transfer chamber by adjusting the internal temperatures of the reaction chamber and the transfer chamber. In accordance with this technique, it is possible to suppress generation of particles caused by reaction by-products, the particles being possibly adhered to the inner walls of the reaction chamber and transfer chamber.

In spite of the above-mentioned countermeasure, however, it is very difficult to completely remove particles from each chamber of the semiconductor processing apparatus. Recently, the design rule of semiconductor integrated circuits has been gradually reduced. Accordingly, there has been a demand for a technique for preventing an even very small amount of particles from being adhered to the surface of a wafer in a stage before the wafer is processed in the processing chamber (a stage until the wafer is completely transferred, for the processing thereof, from the cassette container to the processing chamber). That is, the technique for preventing particles from being adhered to the surface of a wafer in each chamber, in order to transfer a clean wafer, to which no particles are adhered, to the processing chamber, has also been highlighted, in addition to the technique for reducing the amount of particles in each chamber.

Also, Japanese Patent Laid-open Publication No. 2005-354025 discloses a method for peeling off particles adhered to the surface of a wafer loaded in a wafer loading part of a transfer arm by establishing a certain temperature gradient in the wafer loading part, to remove the particles. In accordance with this method, it may be possible to remove particles from a wafer while the wafer is loaded in the wafer loading part of the transfer arm. Thus, an enhancement in throughput may be achieved.

However, the technique disclosed in Japanese Patent Laid-open Publication No. 2005-354025 is different from the technique for preventing particles from being adhered to the surface of the wafer in that the disclosed technique removes particles adhered to the wafer by peeling off the particles. As disclosed in the Patent Document, a certain amount of energy is needed to effectively remove the particles adhered to the wafer through a peel-off method. Accordingly, it is necessary to set the temperature applied to the wafer loading part to a relatively high level (e.g., a level higher than the temperature of the processing chamber by 30K or more). However, it is desirable to avoid application of high-temperature heat to the wafer, if at all possible, in terms of the maintenance of a desired wafer quality and the saving of energy. Further, it may be impossible to completely remove particles, even by using the above-mentioned technique, because particles having a smaller size exhibit higher adherence.

From the above description, it is necessary to provide a technique capable of preventing particles from being adhered to the surface of a wafer without causing the wafer to be heated to high temperature, and thus transferring the wafer in a clean state to the processing chamber, in which a desired process is performed on the wafer.

SUMMARY OF THE INVENTION

The present invention has been made in view of the above-mentioned problems, and it is an object of the present invention to provide a substrate processing apparatus and a particle adhesion preventing method capable of effectively preventing particles from being adhered to a substrate, which will be transferred finally to a processing chamber, for processing thereof, in a stage before the execution of the processing in the processing chamber.

In accordance with an aspect of the present invention, there is provided a substrate processing apparatus comprising: a transfer chamber for performing delivery of a substrate, to be processed, from/to a substrate accommodating container, in which the substrate is accommodated, via a gate at which the substrate accommodating container is set; a processing chamber for performing a specific process on the substrate; a load-lock chamber for connecting the processing chamber with the transfer chamber; and a temperature control unit for adjusting at least one of a temperature of the substrate and an internal temperature of at least one of the transfer chamber and the load-lock chamber, into which the substrate will be loaded, such that the temperature of the substrate just before the substrate is loaded into a selected one of the transfer chamber and the load-lock chamber is maintained to be higher than the internal temperature of the selected chamber.

The load-lock chamber may be directly connected to the processing chamber or may be connected to the processing chamber via a common transfer chamber.

In accordance with another aspect of the present invention, there is provided a method for preventing adhesion of particles to a surface of a substrate, to be processed, in a substrate processing apparatus including: a transfer chamber for performing delivery of the substrate from/to a substrate accommodating container, in which the substrate is accommodated, via a gate at which the substrate accommodating container is set; a processing chamber for performing a specific process on the substrate; and a load-lock chamber for connecting the processing chamber with the transfer chamber, the method comprising: adjusting at least one of a temperature of the substrate and an internal temperature of at least one of the transfer chamber and the load-lock chamber, into which the substrate will be loaded, such that the temperature of the substrate just before the substrate is loaded into a selected one of the transfer chamber and the load-lock chamber is maintained to be higher than the internal temperature of the selected chamber.

In accordance with the apparatus or method of the present invention, the substrate to be processed, which is maintained at a temperature higher than an internal temperature of a chamber, into which the substrate will be loaded, is loaded into the chamber, so that a temperature gradient is established in an atmosphere on the surface of the substrate in the chamber. Due to this temperature gradient, a force acting in a direction away from the substrate is increasingly applied to particles floating in the chamber as the particles gradually approach the surface of the substrate. Accordingly, it may be possible to prevent particles from being attached to the surface of the substrate.

The temperature control unit may include a means to adjust at least one of the temperature of the substrate accommodated in the substrate accommodating container and the internal temperature of the transfer chamber such that the temperature of the substrate just before the substrate is transferred from the substrate accommodating container to the transfer chamber is maintained to be higher than the internal temperature of the transfer chamber.

In accordance with the above configuration, it may be possible to prevent particles from being adhered to the surface of the substrate, to be processed, in the transfer chamber after the substrate is transferred from the substrate accommodating container to the transfer chamber.

Further, the temperature control unit may include a means to adjust at least one of the temperature of the substrate in the transfer chamber and the internal temperature of the load-lock chamber such that the temperature of the substrate just before the substrate is transferred from the transfer chamber to the load-lock chamber is maintained to be higher than the internal temperature of the load-lock chamber.

In accordance with the above configuration, it may be possible to prevent particles from being adhered to the surface of the substrate, to be processed, in the load-lock chamber after the substrate is transferred from the transfer chamber to the load-lock chamber.

Further, the temperature control unit may include a means to adjust at least one of the temperature of the substrate in the load-lock container and the internal temperature of the transfer chamber such that the temperature of the substrate just before the substrate is transferred from the load-lock chamber to the transfer chamber is maintained to be higher than the internal temperature of the transfer chamber.

In accordance with the above configuration, when the substrate completely processed in the processing chamber is returned to the substrate accommodating container, it may be possible to prevent particles from being adhered to the surface of the processed substrate when the substrate is loaded from the load-lock chamber to the transfer chamber.

Further, the temperature control unit may include a light irradiator to adjust the temperature of the substrate by irradiating light having a predetermined wavelength to the substrate. In accordance with the above configuration, it may be possible to heat the substrate by light energy.

For example, the light is a heat ray such as a near infrared ray. Accordingly, when the substrate to be processed is, e.g., a silicon substrate, it may be possible to generate a heat effect at the substrate by allowing near infrared rays to be absorbed into the substrate. As a result, it may be possible to efficiently heat the substrate.

Further, the temperature control unit may include a cool air supplier to adjust the internal temperature of the selected chamber, into which the substrate will be loaded, by supplying, to the selected chamber, cool air adjusted to have a temperature lower than the temperature of the substrate just before the substrate is loaded into the selected chamber. In accordance with the above configuration, it may be possible to perform temperature adjustment such that the temperature of the substrate to be processed becomes higher than the internal temperature of a chamber, into which the substrate will be loaded, by decreasing the internal temperature of the chamber.

In this case, the cool air supplier may include an air supplier for introducing exterior air into an interior of the selected chamber, into which the substrate will be loaded; and a cooler for generating the cool air by cooling the exterior air introduced by the air supplier. In accordance with the above configuration, it may be possible to decrease the internal temperature of the chamber, into which the substrate to be processed will be loaded, while forming a downflow in the chamber. As a result, it is possible not only to reduce the amount of particles in the chamber, but also to prevent particles from being adhered to the surface of the substrate.

Further, the temperature control unit may adjust at least one of the temperature of the substrate and the internal temperature of the selected chamber, into which the substrate will be loaded, such that the temperature of the substrate just before the substrate is loaded into the selected chamber is maintained to be higher than the internal temperature of the selected chamber by 2 to 12° C.

Since only a relatively small temperature difference of 2 to 12° C. may be required, it may be possible to very effectively prevent particles from being adhered to the surface of the substrate, which is transferred in the substrate processing apparatus, without any influence of temperature on the substrate. Further, since only a relatively small temperature difference of 2 to 12° C. may be required, it may be possible to rapidly achieve temperature adjustment for the substrate to be processed and the chamber, into which the substrate will be loaded. Accordingly, it may be possible to prevent particles from being adhered to the surface of the substrate without a reduction in throughput.

In accordance with still another aspect of the present invention, there is provided a substrate processing apparatus, which includes a substrate accommodating container, in which a substrate to be processed is accommodated and which is set at a gate, loads the substrate from the substrate accommodating container into a transfer chamber via the gate, and performs a specific process on the substrate, comprising: a temperature control unit to adjust at least one of a temperature of the substrate and an internal temperature of the transfer chamber such that the temperature of the substrate just before the substrate is loaded from the substrate accommodating container into the transfer chamber is maintained to be higher than the internal temperature of the transfer chamber.

In accordance with still another aspect of the present invention, there is provided a method for preventing adhesion of particles to a surface of a substrate, to be processed, in a substrate processing apparatus, which includes a substrate accommodating container, accommodating therein the substrate and being set at a gate, loads the substrate from the substrate accommodating container into a transfer chamber via the gate, and performs a specific process on the substrate, the method comprising: adjusting at least one of a temperature of the substrate and an internal temperature of the transfer chamber such that the temperature of the substrate just before the substrate is loaded from the substrate accommodating container into the transfer chamber is maintained to be higher than the internal temperature of the transfer chamber.

In accordance with the apparatus or method of the present invention, the substrate to be processed, which is maintained at a temperature higher than the internal temperature of the transfer chamber, is loaded into the transfer chamber, so that a temperature gradient is established in an atmosphere on the surface of the substrate in the transfer chamber. Due to this temperature gradient, a force acting in a direction away from the substrate is increasingly applied to particles floating in the transfer chamber as the particles gradually approach the surface of the substrate. Accordingly, it may be possible to prevent particles from being adhered to the surface of the substrate. In particular, in accordance with the present invention, it may be possible to obtain a high particle attachment preventing effect even in the transfer chamber, which has an atmospheric atmosphere.

The temperature control unit may include a hot air supplier to adjust the temperature of the substrate by supplying, to an interior of the substrate accommodating container, hot air adjusted to have a temperature higher than the internal temperature of the transfer chamber. In accordance with the above configuration, it may be possible to heat the substrate, to be processed, by using temperature-adjusted hot air such that the temperature of the substrate becomes higher than the internal temperature of the transfer chamber, just before the substrate is loaded from the substrate accommodating container (e.g., a cassette container) into the transfer chamber.

The hot air supplier may be arranged in the vicinity of the substrate accommodating container, and is configured to supply the hot air to the interior of the substrate accommodating container via an air hole formed at the substrate accommodating container. In accordance with the above configuration, it may be possible to heat the substrate to be processed, in a closed state of the lid of the substrate accommodating container, because hot air is supplied to the interior of the substrate accommodating container through an air hole formed at the substrate accommodating container. Accordingly, it may be possible to heat only the substrate, without an increase in the internal temperature of the transfer chamber, just before the substrate is transferred from the substrate accommodating container to the transfer chamber. Since the air hole formed at the substrate accommodating container is used, it may be possible to heat the substrate, by using a relatively simple configuration.

Further, the transfer chamber may have an air passage formed in the transfer chamber, to guide the hot air to the gate, and the hot air supplier may supply the hot air through the gate to the interior of the substrate accommodating container via the air passage. In accordance with the above configuration, it may be possible to supply hot air to the interior of the substrate accommodating container through a gap formed between the substrate accommodating container and the lid of the substrate accommodating container when the lid is opened, and thus to heat the substrate to be processed, just before the substrate is transferred from the substrate accommodating container to the transfer chamber.

Further, the transfer chamber may have a plurality of gates, at each gate a corresponding substrate accommodating container being set, and the air passage may be provided for each of the gates. In accordance with the above configuration, it may be possible to efficiently guide hot air into each of the substrate accommodating containers.

Further, the transfer chamber may include a transfer unit having a substrate holder to hold the substrate, and the temperature control unit may include a heater to heat the substrate when the substrate holder holds the substrate after being inserted into the substrate accommodating container, to take the substrate out of the substrate accommodating container. In accordance with the above configuration, it may be possible to heat the substrate to be processed, just before the substrate is transferred from the substrate accommodating container to the transfer chamber.

In accordance with still another aspect of the present invention, there is provided a substrate processing apparatus, which includes a substrate accommodating container, in which a substrate to be processed is accommodated and which is set at a gate, loads the substrate from the substrate accommodating container into a transfer chamber via the gate, and performs a specific process on the substrate, comprising: a receiving chamber connected to the transfer chamber, to temporarily receive the substrate; and a temperature control unit arranged in the receiving chamber, to adjust a temperature of the substrate received in the receiving chamber such that the temperature of the substrate is higher than an internal temperature of the transfer chamber.

In accordance with the apparatus of the present invention, it may be possible to heat the substrate to be processed, in the receiving chamber, such that the temperature of the substrate is higher than the internal temperature of the transfer chamber, by loading the substrate into the receiving chamber. When the substrate is subsequently transferred to the transfer chamber, a temperature gradient is established in an atmosphere in the vicinity of the surface of the substrate. As a result, it is possible to prevent particles from being adhered to the surface of the substrate.

Further, the receiving chamber may function as a position aligning chamber to perform position alignment on the substrate, and the temperature control unit may adjust the temperature of the substrate placed on a mounting table arranged in the position aligning chamber.

In accordance with the above configuration, it may be possible to heat the substrate to be processed, in the position aligning chamber, such that the temperature of the substrate becomes higher than the internal temperature of the transfer chamber, by loading the substrate into the position aligning chamber, for position alignment. When the substrate is subsequently transferred to the transfer chamber, a temperature gradient is established in an atmosphere in the vicinity of the surface of the substrate. As a result, it is possible to prevent particles from being adhered to the surface of the substrate. Since it may be possible to heat the substrate while executing the position alignment of the substrate, an enhancement in throughput may be achieved, compared to the case in which the heating and position alignment are performed separately.

In this case, the temperature adjusting means may include, e.g., a heater to adjust the temperature of the substrate, to be processed, by heating the mounting table. Further, the temperature control unit may include a light irradiator to adjust the temperature of the substrate by irradiating light having a predetermined wavelength to the substrate placed on the mounting table. In accordance with this configuration, it may be possible to heat the substrate such that the temperature of the substrate becomes higher than the internal temperature of the transfer chamber, by using a relatively simple configuration.

In accordance with still another aspect of the present invention, there is provided a substrate processing apparatus, which transfers a substrate, to be processed, accommodated in a substrate accommodating container to a processing chamber via one or more chambers, and performs a specific process on the substrate, comprising: a temperature control unit to adjust at least one of a temperature of the substrate and an internal temperature of at least one of the chambers, through which the substrate will pass between the substrate accommodating container and the processing chamber, such that the temperature of the substrate just before the substrate is loaded into a selected one of the chambers is maintained to be higher than the internal temperature of the selected chamber.

In accordance with this apparatus, the substrate to be processed, which is maintained at a temperature higher than an internal temperature of a chamber, into which the substrate will be loaded, is loaded into the chamber, so that a temperature gradient is established in an atmosphere on the surface of the substrate in the chamber. Due to this temperature gradient, a force acting in a direction away from the substrate is increasingly applied to particles floating in the chamber as the particles gradually approach the surface of the substrate. Accordingly, it may be possible to prevent particles from being adhered to the surface of the substrate.

Further, preferably, the selected chamber, into which the substrate will be loaded, has an internal pressure of 200 Torr or more. Further, more preferably, the selected chamber, into which the substrate will be loaded, has an internal pressure of 300 Torr or more. In a chamber of at least 200 Torr or at least 300 Torr, it may be possible to more effectively prevent particles from being adhered to the surface of the substrate to be processed, by loading the substrate into the chamber under the condition that the substrate is maintained at a temperature higher than the internal temperature of the chamber.

When it is possible to prevent particles from being adhered to the surface of the substrate to be processed, which is transferred finally to a processing chamber, in accordance with the present invention, it may be possible to load the substrate in a clean state in the processing chamber, and thus to securely perform a desired process on the substrate. Meanwhile, in accordance with the present invention, when the processed substrate is returned to the substrate accommodating container, it may also be possible to prevent particles from being adhered to the surface of the processed substrate during the transfer of the substrate.

BRIEF DESCRIPTION OF THE DRAWINGS

FIG. 5 is a table obtained by classifying the particles adhered to the wafers in the test shown in FIG. 4, in terms of size.

FIG. 7 is a table obtained by classifying the particles adhered to the wafers in the test shown in FIG. 6, in terms of size.

DETAILED DESCRIPTION OF THE EMBODIMENTS

Figure 1:
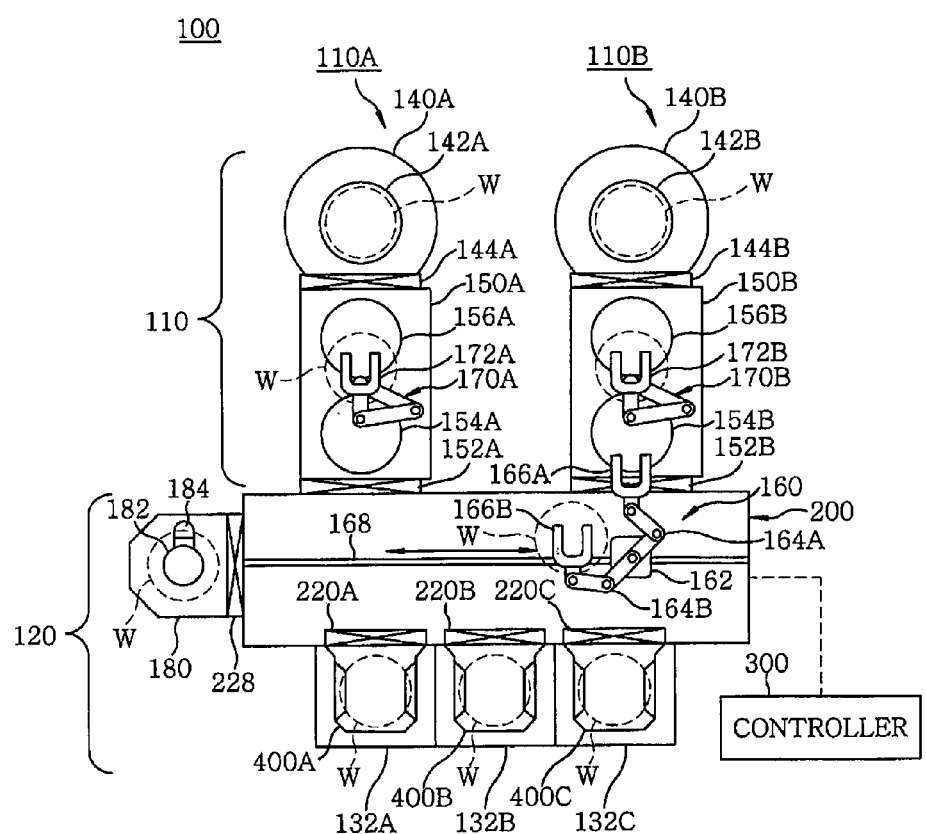
FIG. 1 is a cross sectional view showing a schematic configuration of a substrate processing apparatus in accordance with a first embodiment of the present invention.

Hereinafter, embodiments of the present invention will be described with reference to the accompanying drawings. In the specification and drawings, constituent elements having substantially the same functions will be designated by the same reference numerals, and a redundant description thereof will be omitted.

Substrate Processing Apparatus of First Embodiment

First, an exemplary configuration of a substrate processing apparatus 100 in accordance with a first embodiment of the present invention will be described with reference to the accompanying drawings. In this case, the substrate processing apparatus 100 includes one, two or more vacuum processing units connected to a transfer chamber. FIG. 1 is a cross sectional view showing a schematic configuration of the substrate processing apparatus 100 in accordance with the first embodiment.

The substrate processing apparatus 100 includes one, two or more vacuum processing units 110 to perform various processes such as a film forming process or an etching process on a substrate to be processed, e.g., a semiconductor wafer W (hereinafter, also simply referred to as a "wafer"), and a transfer unit 120 to perform loading and unloading of the wafer W with respect to the vacuum processing units 110. The transfer unit 120 includes a transfer chamber 200 used in common in transferring the wafer W.

FIG. 1 illustrates an example in which two vacuum processing units 110A and 110B are arranged at one side of the transfer unit 120. The vacuum processing units 110A and 110B include processing chambers 140A and 140B and load-lock chambers 150A and 150B installed to be connected to the processing chambers 140A and 140B, respectively, and configured such that they can be exhausted to a vacuum state. The vacuum processing units 110A and 110B may perform a same process or different processes on wafers W in the processing chambers 140A and 140B. In the processing chambers 140A and 140B, mounting tables 142A and 142B, on which wafers W are placed, are provided, respectively. The number of the vacuum processing units 110 each having the processing chamber 140 and the load-lock chamber 150 is not limited to two. Three or more vacuum processing units 110 may be provided.

The transfer chamber 200 of the transfer unit 120 is configured as a box body having a substantially rectangular cross section. A nonreactive gas, e.g., $N_2$ gas, or clean air is supplied to the box body. A plurality of cassette stages 132A to 132C, on which respective cassette containers 400A to 400C accommodating substrates are placed, are arranged in parallel at one longitudinal side surface of the transfer chamber 200 having the substantially rectangular cross section. In the case of FIG. 1, for example, three cassette containers 400A to 400C are placed on the cassette stages 132A to 132C, respectively. The numbers of cassette stages and cassette containers are not limited to the above-described value, and they may be one or two, or they may be four or more.

Each of the cassette containers 400A to 400C is of a sealed structure capable of accommodating, e.g., 25 wafers W at maximum, such that the wafers W are stacked in multiple levels at an equal pitch. The interior of each of the cassette containers 400A to 400C is filled with, e.g., $N_2$ gas, to establish an $N_2$ gas atmosphere. The wafers W may be transferred among the cassette containers 400A to 400C and the transfer chamber 200 through opening/closing doors 220A to 220C.

A transfer mechanism (transfer means) 160 is provided in the transfer chamber 200, to transfer a wafer W in a longitudinal direction (a direction indicated by an arrow in FIG. 1). The transfer mechanism 160 is fixedly mounted on, e.g., a base 162. The base 162 is configured such that it is slidably movable along a guide rail 168 arranged at a central portion of the transfer chamber 200 to extend in the longitudinal direction of the transfer chamber 200 by using, e.g., a linear motor driving mechanism. For example, the transfer mechanism 160 may be a double arm mechanism including two multi-joint arms 164A and 164B and two picks 166A and 166B serving as substrate supporting members, as shown in FIG. 1, or may be a single arm mechanism including only one pick.

Rear ends of the two load-lock chambers 150A and 150B are connected to the other longitudinal side surface of the transfer chamber 200 having the substantially rectangular cross section via gate valves (atmospheric side gate valves) 152A and 152B configured to be openable and closable, respectively. Front ends of the load-lock chambers 150A and 150B are connected to the processing chambers 140A and 140B via gate valves (vacuum side gate valves) 144A and 144B configured to be openable and closable, respectively.

Two pairs of buffer mounting tables 154A and 156A and 154B and 156B are provided in respective load-lock chambers 150A and 150B, to temporarily hold the wafer W in a standby state. Here, the buffer mounting tables 154A and 154B arranged at a side close to the transfer chamber 200 will be referred to as "first buffer mounting tables", whereas the buffer mounting tables 156A and 156B arranged at a side close to the processing chambers 140A and 140B will be referred to as "second buffer mounting tables". Individual transfer mechanisms (vacuum side transfer mechanisms) 170A and 170B are arranged between the buffer mounting tables 154A and 156A and between the buffer mounting tables 154B and 156B, respectively. Each of the individual transfer mechanisms 170A and 170B includes a multi-joint arm capable of performing bending, rotation, and elevation.

Picks 172A and 172B are provided at front ends of the individual transfer mechanisms 170A and 170B, respectively. By using the picks 172A and 172B, delivery (transport) of a wafer W is carried out between the first and second buffer mounting tables 154A and 156A and between the first and second buffer mounting tables 154B and 156B. Loading and unloading of a wafer W between the load-lock chambers 150A and 150B and the processing chambers 140A and 140B are carried out by using the individual transfer mechanisms 170A and 170B.

An orienter (pre-alignment stage) 180 serving as a positioning device for a wafer W is connected to one end of the transfer chamber 200, namely, one widthwise side surface of the transfer chamber 200 having the substantially rectangular cross section, via a gate valve 228. The orienter 180 includes, e.g., a rotation table 182, and an optical sensor 184 to optically detect a circumferential edge of the wafer W placed on the rotation table 182. The orienter 180 performs position alignment on the wafer W by detecting an orientation flat or notch of the wafer W.

The substrate processing apparatus 100 further includes a controller 300 to control the overall operation of the apparatus 100. The controller 300 executes a certain program, based on predetermined information, to control each unit of the apparatus 100. Accordingly, under control of the controller 300, for example, processes in the processing chambers 140A and 140B, wafer transfer in the load-lock chambers 150A and 150B, and position alignment in the orienter 180 are executed. The controller 300 further controls a temperature control unit which will be described later.

Configuration of Temperature Control Unit of First Embodiment

Figure 2:
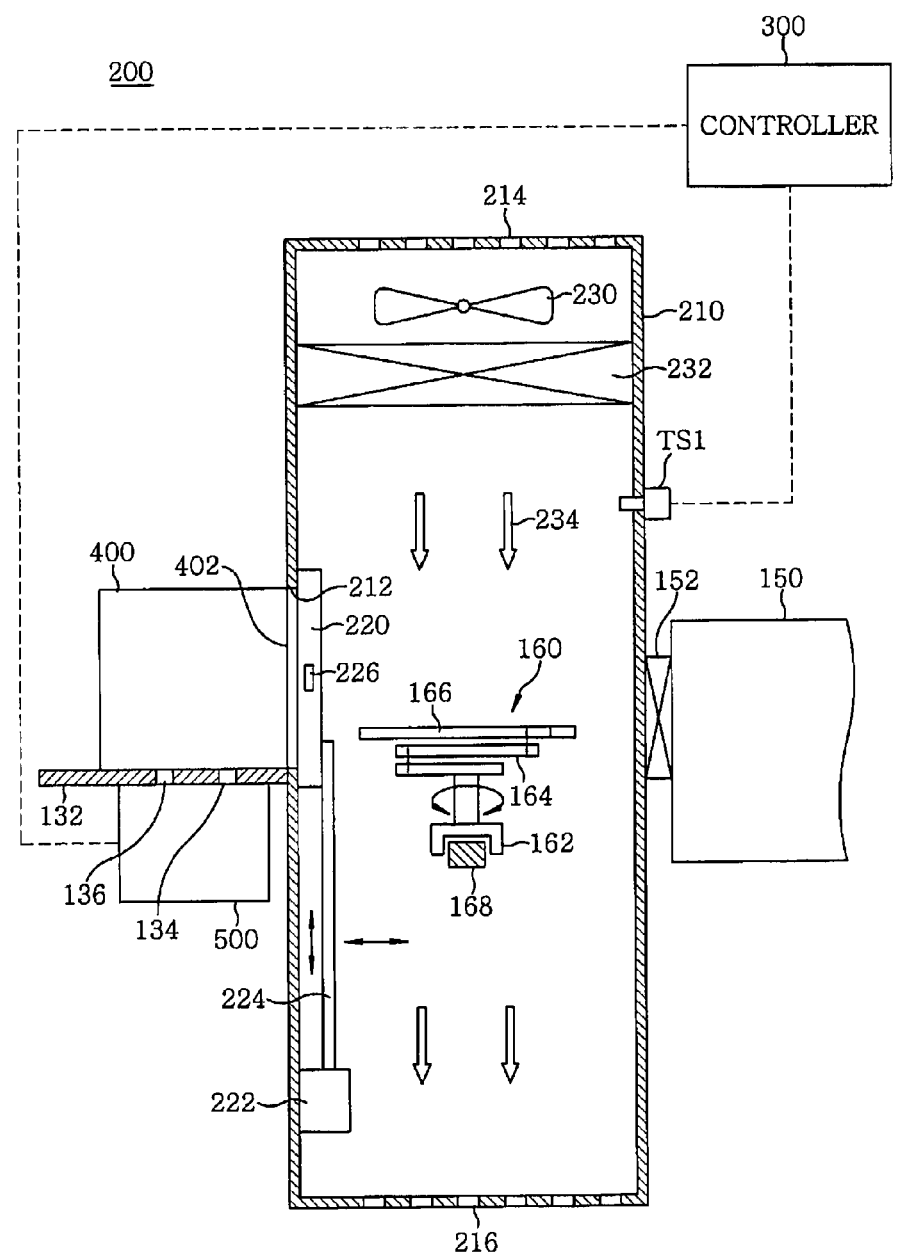
FIG. 2 is a longitudinal cross sectional view showing a schematic configuration of a cassette stage, to which a hot air supplier in accordance with the first embodiment of the present invention is connected, and a configuration of a transfer chamber, to which the cassette stage is connected.

Next, an exemplary configuration of the temperature control unit in accordance with the first embodiment will be described with reference to FIG. 2. FIG. 2 schematically illustrates a longitudinal cross sectional view showing a configuration of one cassette stage 132 connected to the temperature control unit in accordance with the first embodiment, and a configuration of the transfer chamber 200 connected to the cassette stage 132. FIG. 2 is a view taken from one end of the transfer chamber 200. In this embodiment, the cassette stages 132A to 132C have substantially a same configuration, and the cassette containers 400A to 400C have substantially a same configuration. In FIG. 2, only the cassette stage 132 and cassette container 400 are illustrated as representative ones of the cassette stages 132A to 132C and cassette containers 400A to 400C.

First, an exemplary configuration of the transfer chamber 200 will be described. The transfer chamber 200 is defined by a housing 210 made of, e.g., stainless steel or aluminum. The cassette stage 132, on which the cassette container 400 is placed, is connected to one sidewall of the housing 210. A substrate gate 212 is formed at the sidewall of the housing 210 at a position corresponding to the cassette container 400. Delivery of the wafer W between the cassette container 400 and the transfer chamber 200 is carried out through the substrate gate 212.

A door 220 is provided at the substrate gate 212, to open or close the substrate gate 212. The door 220 and a door driving mechanism which will be described later function as a lid detachment mechanism to attach/detach a lid 402 for closing the cassette container 400 to/from the cassette container 400.

Hereinafter, an exemplary configuration of the door 220 will be described in detail. The door 220 includes a lid opening/closing mechanism 226, which is inserted into a key groove (not shown) formed at the lid 402 of the cassette container 400 and rotated to perform a lock/unlock operation. Details of the lid opening/closing mechanism 226 are disclosed in, e.g., Japanese Patent Laid-open Publication No. 2001-77177.

Further, the door 220 is connected to a door moving mechanism. The door moving mechanism drives the lid 402 of the cassette container 400 and the door 220 in horizontal and vertical directions to open or close the lid 402 and door 220. For example, as shown in FIG. 2, the door moving mechanism includes an actuator 222 for driving the door 220 in horizontal and vertical directions, and a retractable rod 224 connected to the door 220.

The retractable rod 224 can be extended or retracted by using the actuator 222, to move the door 220 in vertical directions (directions indicated by upward and downward arrows in FIG. 2). Also, the retractable rod 224 can drive the door 220 in forward and backward directions with respect to the substrate gate 212 (directions to open and close the lid 402 of the cassette container 400, namely, directions indicated by left and right arrows in FIG. 2) in accordance with operation of the actuator 222. For example, the substrate gate 212 is closed as the door 220 is forwardly moved toward the substrate gate 212 by using the retractable rod 224.

The lid 402 is unlocked by using the lid opening/closing mechanism 226 and the door 220 is retracted together with the lid 402 in accordance with operation of the actuator 222. Accordingly, the lid 402 is separated from the cassette container 400, and enters the transfer chamber 200, together with the door 220. Then, when the retractable rod 224 is retracted, the door 220 is downwardly moved away from the substrate gate 212, together with the lid 402, so that the substrate gate 212 is opened to allow loading and unloading of a wafer W.

A plurality of air supply holes 214 are formed in a ceiling portion of the housing 210. A plurality of air discharge holes 216 are formed in a bottom portion of the housing 210. An air supply fan 230 is provided under the air supply holes 214 to supply exterior air into the transfer chamber 200 through the air supply holes 214. An air filter 232 is provided under the air supply fan 230 to filter the exterior air introduced via the air supply fan 230.

The air filter 232 includes a particle removing filter to remove particles contained in the exterior air introduced through the air supply holes 214. The particle removing filter may include, e.g., a high efficiency particulate air (HEPA) filter, an ultra low penetration air (ULPA) filter or the like.

The air filter 232 is not limited to the above-described filter. For example, the air filter 232 may include a chemical filter, an activated carbon filter, or the like, which may be combined with the particle removing filter.

In accordance with the above-described configuration, exterior air is introduced into the transfer chamber 200 through the air supply ports 214 by using the air supply fan 230, and then discharged out of the transfer chamber 200 through the air discharge holes 216 after being cleaned by using the air filter 232. In this case, a downflow 234 of air directed from the top to the bottom is formed in the transfer chamber 200. The downflow 234 functions to discharge particles generated in the transfer chamber 200 out of the transfer chamber 200. An air discharge fan may be provided above the air discharge ports 216 (inside of the transfer chamber 200) or under the air discharge ports 216 (outside of the transfer chamber 200) to actively discharge air from the transfer chamber 200.

In accordance with the size of the housing 210, preferably, a plurality of air supply fans 230 and a plurality of air filters 232 may be arranged at the ceiling portion of the housing 210. In this case, a uniform flow rate of the downflow 234 is formed throughout the transfer chamber 200.

In the transfer chamber 200 having the above-described configuration, it is possible to restrict the amount or size of particles introduced into the transfer chamber 200 together with exterior air by introducing the exterior air via the air filter 232. Meanwhile, particles may be generated due to operation of a driving system including the substrate transfer mechanism or lid opening/closing mechanism, a lubricant such as grease, or friction between parts. However, it may be impossible to completely inhibit the generation (presence) of particles in the transfer chamber 200 (namely, to completely remove the particles from the transfer chamber 200) by using only the downflow through the air supply filter 232. Accordingly, the problem that particles may be adhered to a surface of an unprocessed wafer W in the transfer chamber 200 provided with the air supply filter 232, during transfer of the wafer W, may still remain to be resolved.

In particular, recently, the design rule of semiconductor integrated circuits has been gradually reduced. Thus, there has been a demand for a technique for preventing even very small amount of particles from being adhered to a surface of a wafer W in a stage before a process is carried out on the wafer W.

Therefore, in this embodiment, a temperature control unit is provided to adjust at least one of the temperature of the wafer W and an internal temperature of a next chamber, i.e., the transfer chamber 200, to the cassette container 400 in a transfer direction of the wafer W, such that the temperature of the wafer W just before the wafer W is loaded into the transfer chamber 200 is higher than the internal temperature of the transfer chamber 200. Accordingly, since the wafer W is loaded into the transfer chamber 200 under the condition that the temperature of the wafer W is higher than the internal temperature of the transfer chamber 200, a temperature gradient is established in an atmosphere on the surface of the wafer W in the transfer chamber 200. Due to this temperature gradient, a force acting in a direction away from the wafer W is increasingly applied to particles floating in the transfer chamber 200, wherein the magnitude of the force increases as the particles gradually approach closer to the surface of the wafer W. Accordingly, it may be possible to prevent particles from being adhered to the surface of the wafer W. A detailed exemplary configuration of the temperature control unit will be described later.

Temperature Control Unit of First Embodiment

Hereinafter, a detailed exemplary configuration of the temperature control unit in accordance with the first embodiment will be described with reference to the accompanying drawings. The temperature control unit in accordance with the first embodiment includes a hot air supplier 500 for adjusting the temperature of wafers W in the cassette container 400 by supplying, to the interior of the cassette container 400, hot air adjusted to have a temperature higher than the temperature of a next chamber, i.e., the transfer chamber 200.

Figure 3:
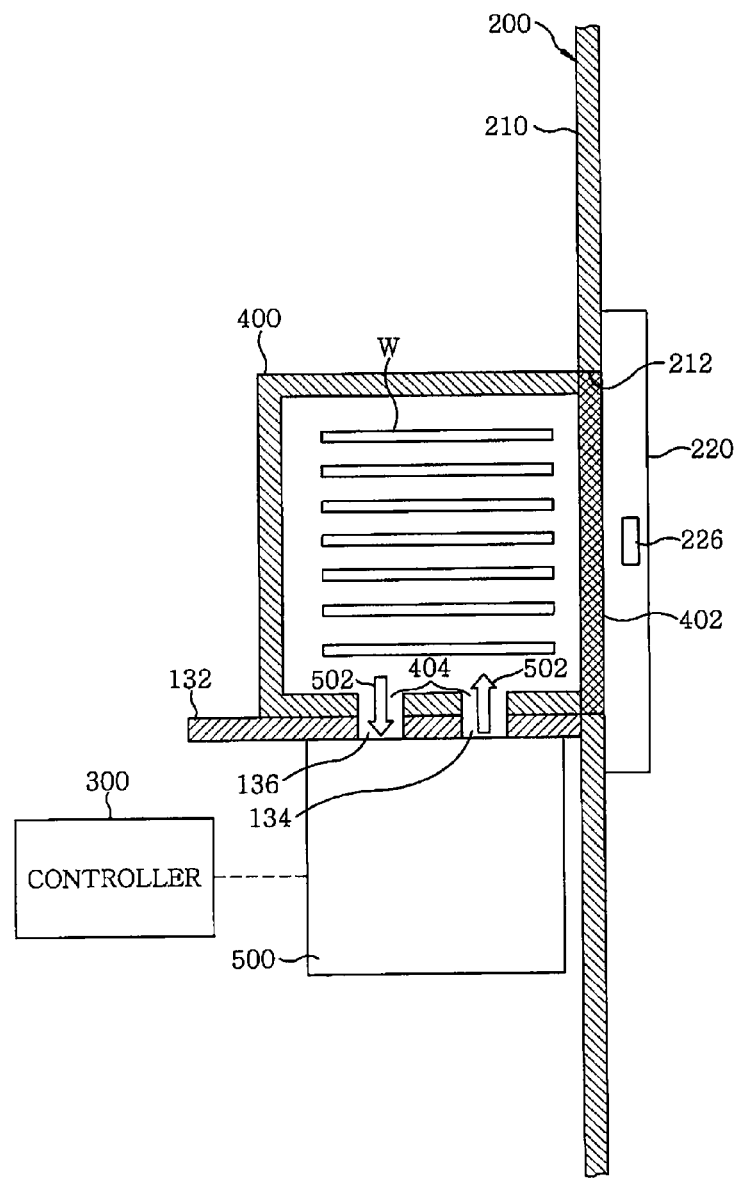
FIG. 3 is an enlarged view illustrating the hot air supplier and the surroundings thereof.

FIG. 3 is an enlarged view illustrating the hot air supplier 500 and the surroundings thereof. The hot air supplier 500 is provided near the cassette container 400, e.g., under the cassette stage 132, as shown in FIGS. 2 and 3. The hot air supplier 500 is controlled by, e.g., the controller 300 for controlling each part of the substrate processing apparatus 100.

Specifically, for example, the controller 300 adjusts the temperature of the hot air to be supplied to the cassette container 400 by controlling the hot air supplier 500, based on the internal temperature of the transfer chamber 200 measured by using a temperature sensor TS1 provided in the transfer chamber 200, such that the temperature of the wafers W becomes higher than the internal temperature of the transfer chamber 200 by a predetermined temperature (e.g., 3° C.). Thus, it may be possible to adjust the temperature of wafers W in the cassette container 400 in accordance with the internal temperature of the transfer chamber 200.

The measurement of the internal temperature of the transfer chamber 200 by using the temperature sensor TS1 may be carried out only once when the substrate processing apparatus 100 begins to be operated, if the temperature environment of the place where the substrate processing apparatus 100 is installed is constant, for example, if the substrate processing apparatus 100 is installed in a clean room. However, when the temperature environment at the installation place of the substrate processing apparatus 100 may easily vary, it is desirable to periodically measure the internal temperature of the transfer chamber 200.

In this embodiment, a plurality of air holes 404 are formed in a bottom portion of the cassette container 400, to cope with a pressure variation occurring in the surrounding environment during the transfer of the cassette container 400. The cassette stage 132 includes a hot air supply port 134 to supply hot air 502 from the hot air supplier 500 to the cassette container 400 through the air hole 404 of the cassette container 400 corresponding to the hot air supply port 134, and a hot air discharge port 136 to return the hot air 502 from the cassette container 400 to the hot air supplier 500 through the air hole 404 corresponding to the hot air discharge port 136.

In accordance with the above-described configuration, the hot air supplier 500 supplies, to the interior of the cassette container 400, hot air 502 controlled to have a predetermined temperature in accordance with a command from the controller 300. In this case, the hot air 502 is introduced into the cassette container 400 placed on the cassette stage 132 via the hot air supply port 134 and the air hole 404. After entering the cassette container 400, the hot air 502 returns to the hot air supplier 500 via the air hole 404 and the hot air discharge port 136. By using the hot air 502, the temperature of the atmosphere in the cassette container 400 is increased, so that the temperature of wafers W contained in the cassette container 400 may be adjusted to have a predetermined temperature. The hot air 502 may be generated by heating dry air.

Operation Example of Substrate Processing Apparatus of First Embodiment

Now, an operation example of the substrate processing apparatus 100 having the above-described configuration in accordance with the first embodiment will be described. First, when the cassette container 400, which contains a plurality of wafers W, is placed on the cassette stage 132, the controller 300 controls the hot air supplier 500, to supply the hot air 502 having a predetermined temperature to the interior of the cassette container 400 via the hot air supply port 134 and the air hole 404.

In this case, the controller 300 may determine a target temperature, based on the internal temperature information of the transfer chamber 200 acquired from the temperature sensor TS1, and calculate the temperature or supply time of the hot air 502 required for the wafers W contained in the cassette container 400 to reach the target temperature. Based on the result of the calculation, the controller 300 controls the hot air supplier 500. In this case, whether or not the wafers W have been adjusted to have the target temperature may be determined, based on whether or not the supply time of the hot air 502 has elapsed. In this embodiment, the controller 300 controls the hot air supplier 500 such that the temperature of the wafers W contained in the cassette container 400 is higher than the internal temperature of the transfer chamber 200 by, e.g., 3° C.

When it is determined that unprocessed wafers W contained in the cassette container 400 have been adjusted to have the target temperature, (for example, it is determined that the predetermined supply time of the hot air 502 has elapsed), the controller 300 drives the retractable rod 224 in horizontal and vertical directions, to move the door 220 and lid 402 into the transfer chamber 200. Accordingly, the substrate gate 212 is opened.

Thereafter, the transfer mechanism 160 takes a wafer W, to be processed, out of the cassette container 400, and then loads the wafer W into a next chamber, i.e., the transfer chamber 200 that is located next to the cassette container 400 in the transfer direction of the wafer W. The transfer mechanism 160 then transfers the wafer W to the orienter 180. In the orienter 180, position alignment of the wafer W is carried out. The transfer mechanism 160 receives the position-aligned wafer W from the orienter 180 and holds the received wafer W. The transfer mechanism 160 then transfers the wafer W to a position just before the load-lock chamber 150A or 150B of the vacuum processing unit 110A or 110B, which performs a process on the wafer W.

Subsequently, when the gate valve 152A or 152B is opened, the transfer mechanism 160 loads the held wafer W from the transfer chamber 200 to the load-lock chamber 150A or 150B. After completion of the loading of the wafer W into the load-lock chamber 150A or 150B, the gate valve 152A or 152B is closed.

When the gate valve 144A or 144B is opened, the individual transfer mechanism 170A or 170B loads the wafer W from the load-lock chamber 150A or 150B into the processing chamber 140A or 140B. After completion of the loading of the wafer W into the processing chamber 140A or 140B, the gate valve 144A or 144B is closed. In the processing chamber 140A or 140B, a specified process such as an etching process or a film forming process is carried out on the wafer W.

When the gate valve 144A or 144B is opened after completion of the process performed on the wafer W in the processing chamber 140A or 140B, the individual transfer mechanism 170A or 170B transfers the wafer W to the load-lock chamber 150A or 150B. After completion of the transfer of the wafer W to the load-lock chamber 150A or 150B, the gate valve 144A or 144B is closed. Then, the wafer W is transferred to the transfer chamber 200. That is, in order to eliminate a pressure difference between the transfer chamber 200 maintained in an atmospheric state and the load-lock chamber 150A or 150B, the load-lock chamber 150A or 150B is opened to the atmosphere and, then, the gate valve 152A or 152B is opened. The transfer mechanism 160 then transfers the processed wafer W from the load-lock chamber 150A or 150B to the transfer chamber 200. Subsequently, the transfer mechanism 160 returns the wafer W to the cassette container 400. Thus, the specified process of the wafer W is completed.

As described above, the wafer W taken out of the cassette container 400 is moved in the transfer chamber 200 until it is loaded into the load-lock chamber 150A or 150B. In this case, a temperature gradient is always established on the surface of the wafer W in the transfer chamber 200 because the temperature of the wafer W has been adjusted to be higher than the internal temperature of the transfer chamber 200 by a predetermined temperature (e.g., 3° C.). Due to this temperature gradient, it is possible to prevent particles from being adhered to the surface of the wafer W being transferred in the transfer chamber 200. As a result, it is possible to transfer an unprocessed wafer W maintained in a clean state without having particles adhered to the surfaces thereof, to the vacuum processing unit 110, that is, from the load-lock chamber 150A or 150B to the processing chamber 140A or 140B.

Test Results

A description will be given with reference to FIGS. 4 and 5, as to a result of a test confirming the effect of preventing particles from being adhered to the surface of the wafer W by adjusting the temperature of the wafer W to be higher than the internal temperature of the transfer chamber 200. In this test, two wafers Wa and Wb of a same kind were prepared as wafer samples. One wafer Wa was maintained at the room temperature of a test room, whereas the other wafer Wb was heated to a temperature higher than the room temperature. Under this condition, the wafers Wa and Wb were left for a predetermined time in the test room, in which a particle floating atmosphere under an atmospheric pressure was established. Thereafter, the number of particles adhered to each of the wafers Wa and Wb was measured.

Figure 4:
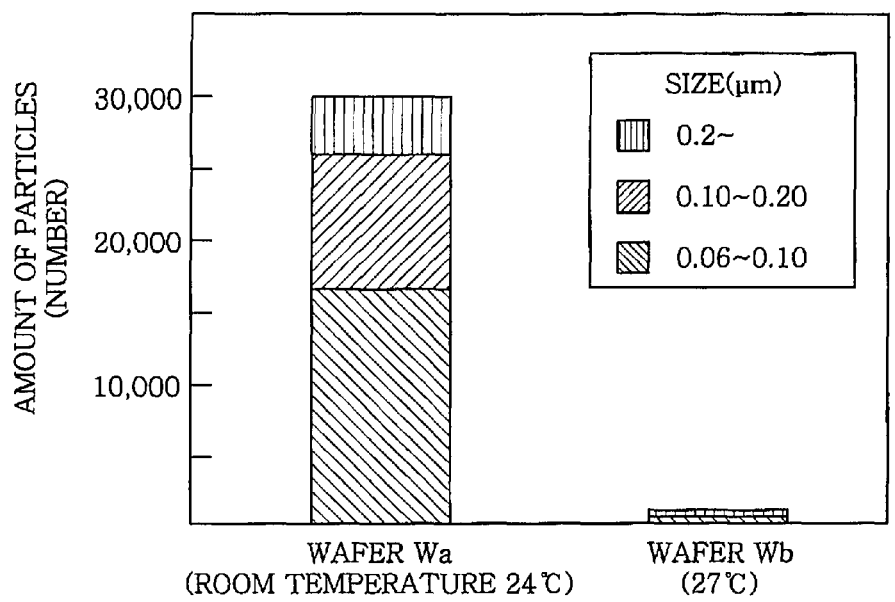
FIG. 4 is a graph depicting results of a test to compare the numbers of particles adhered to the surfaces of wafers respectively maintained at room temperature and 27° C.

FIG. 4 is a graph depicting the results of a comparison between the numbers of particles adhered to the surfaces of the wafers Wa and Wb when a test was performed under the condition that the wafer Wa was maintained at the room temperature of the test room (24° C.), whereas the wafer Wb was heated to 27° C. higher than the room temperature by 3° C. FIG. 5 is a table obtained by classifying the particles adhered to the wafers Wa and Wb in the above-described test, in terms of size.

Referring to the graph of FIG. 4 and the table of FIG. 5, it can be seen that it is possible to considerably reduce the amount of particles adhered to the surface of the wafer W by heating the wafer W. In the test, the amount of particles adhered to the wafer Wb having a temperature higher by 3° C. than the room temperature of the test room was reduced to about 3% of the amount of particles adhered to the wafer Wa maintained at the room temperature of the test room. Thus, it can be seen that it is possible to reduce the adhesion amount of particles by an amount corresponding to 2 digits of the total adhesion amount simply by increasing the temperature of the wafer W to a temperature higher than the room temperature of the test room by about 3° C. In this test, in particular, it was possible to almost completely prevent adhesion of particles of size ranging from 0.10 to 0.20 µm to the surface of the wafer Wb. Practically, the majority of particles floating in the transfer chamber 200 have a size ranging from 0.10 to 0.20 µm. When this fact is taken into consideration, the effect of this embodiment which almost completely prevents adhesion of particles having the above-described size is great.

The same test as described above was performed to evaluate an effect exhibited when the temperature of the wafer W was further increased. The test results will be described with reference to FIGS. 6 and 7. In this test, two wafers Wc and Wd of the same kind were prepared as wafer samples, as in the previous test.

Figure 6:
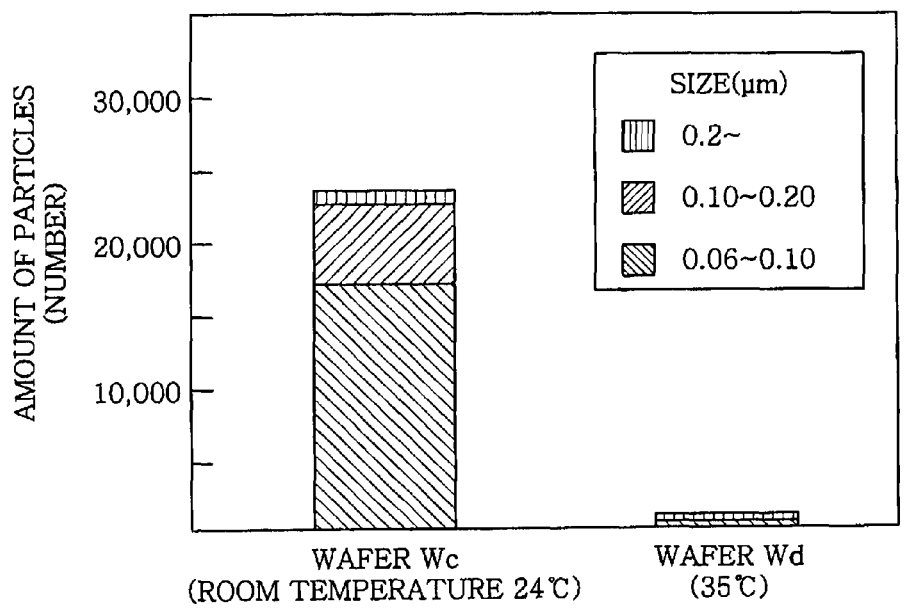
FIG. 6 is a graph depicting results of a test to compare the numbers of particles adhered to the surfaces of wafers respectively maintained at room temperature and 35° C.

FIG. 6 is a graph depicting the results of a comparison between the numbers of particles adhered to the surfaces of the wafers Wc and Wd when a test was performed under the condition that the wafer Wc was maintained at the room temperature of the test room (24° C.), whereas the wafer Wd was heated to 35° C. higher by 11° C. than the room temperature. FIG. 7 is a table obtained by classifying the particles adhered to the wafers We and Wd in the above-described test, in terms of size.

By comparing the graph of FIG. 6 and the table of FIG. 7 with the graph of FIG. 4 and the table of FIG. 5, it can be seen that the effect of preventing adhesion of particles to the surface of the wafer W is further increased by further increasing the temperature of the wafer W. When the wafer Wd was heated such that the difference between the temperature of the wafer Wd and the room temperature of the test room was 11° C., the adhesion amount of particles was reduced to about 2% of the adhesion amount of particles in the case of the room temperature, smaller than 3% for the case in which the wafer heating was carried out such that the temperature difference was 3° C.

From the results of the test, it is inferred that there is a correlation between the temperature of the wafer W and the amount of particles adhered to the surface of the wafer W. Accordingly, a test was also conducted to compare the particle adhesion amounts of wafer samples whose temperatures were adjusted to have temperature differences of −4.2° C., −2.1° C., +1.0° C., +2.2° C., +4.7° C., +12.0° C., +15.7° C. and +18.8° C. from the room temperature, respectively, with the particle adhesion amount of a wafer sample adjusted to have a room temperature, for various sizes (0.06 µm, 0.08 µm, and 0.10 µm). The results of this test are depicted in a graph of FIG. 8.

Figure 8:
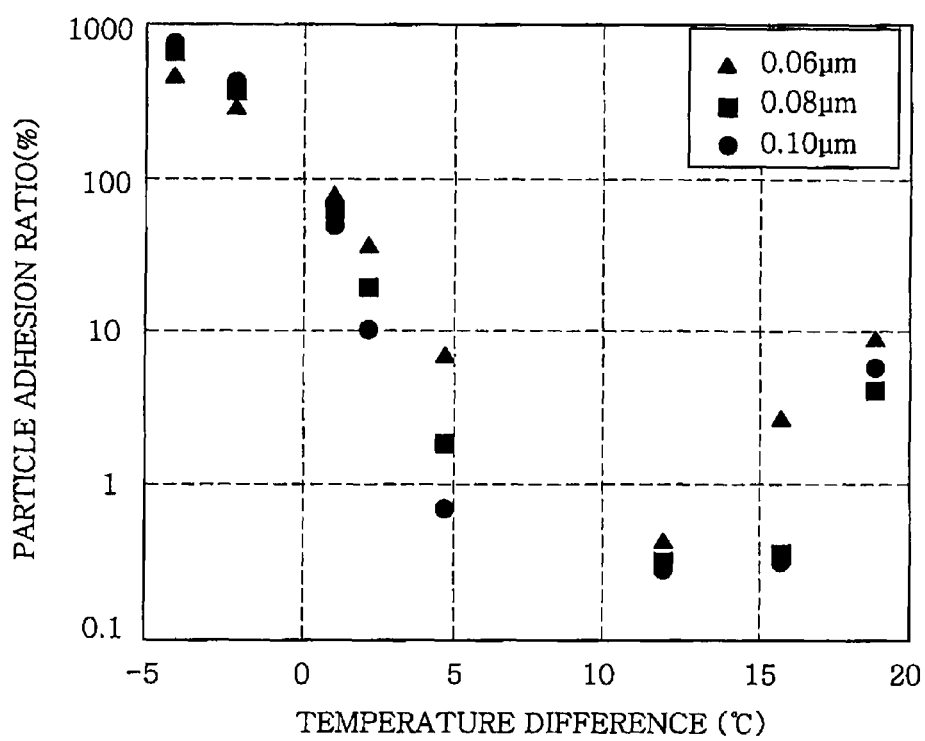
FIG. 8 illustrates a relationship between the amount of particles adhered to the surface of a wafer and the temperature of the wafer on the basis of room temperature.

Referring to the graph of FIG. 8, it can be seen that it is possible to reduce the particle adhesion amount of the wafer W, irrespective of the size of particles, by increasing the temperature of the wafer W to be higher than the room temperature of the test room. It can also be seen that it is possible to further reduce the adhesion amount of particles when the temperature of the wafer W is further higher than the room temperature within a temperature difference ranging from about ±0° C. to +12° C. from the room temperature. This may be because the atmosphere around the wafer W exhibits a sharper temperature gradient in the vicinity of the surface of the wafer W when the temperature of the wafer W is higher than the temperature of the atmosphere, so that the particle adhesion preventing effect is enhanced.

Meanwhile, when the temperature difference between the temperature of the wafer W and the room temperature of the test room is higher than 12° C., the particle adhesion rate increases, even though this increase is slight. Accordingly, it is preferable that the adjustment range of the difference between the temperature of the wafer W and the internal temperature of the transfer chamber 200 (the temperature adjustment range of the wafer W in this embodiment) be ranging from about 2 to 12° C.

When it is desired to obtain a larger difference between the temperature of the wafer W and the internal temperature of the transfer chamber 200, more time is required for temperature adjustment. Accordingly, the temperature adjustment value of the wafer W may be set to be, e.g., +2 to 3° C., taking throughput into consideration. Even in such a temperature difference range, it is possible to reduce the particle adhesion amount to 10%. Meanwhile, even though the wafer W is heated by about +2 to 12° C., there is no adverse effect on the quality of the wafer W. It is also possible to reduce power consumption for the execution of the temperature adjustment.

Through the test, it has been confirmed that it is possible to prevent particles from being adhered to the surface of the wafer W by adjusting the temperature of the wafer W to a temperature higher than the internal temperature of the transfer chamber 200, as described above. The reason may be as follows.

Particles floating in the vicinity of the surface of the wafer W are attracted to the surface of the wafer W due to an attractive force such as gravity or electrostatic force applied to the particles. In this case, when the temperature of the wafer W is higher than the ambient temperature around the wafer W, a temperature gradient is established in the atmosphere in the vicinity of the surface of the wafer W. In accordance with the slope of the temperature gradient, a repulsive force such as a thermophoretic force may be generated.

This temperature gradient is established in such a fashion that a higher temperature is exhibited at a position nearer to the surface of the wafer W. Accordingly, a repulsive force such as a thermophoretic force, which is exerted on particles floating in the vicinity of the surface of the wafer W, is increased at a position nearer to the surface of the wafer W. As a result, the repulsive force such as the thermophoretic force, which is exerted on particles in the vicinity of the surface of the wafer W due to the temperature gradient, is higher than the attractive force such as gravity or electrostatic force exerted on the particles, at a position nearer to the surface of the wafer W. Thus, it may be possible to prevent particles from being adhered to the surface of the wafer W.

Figure 9:
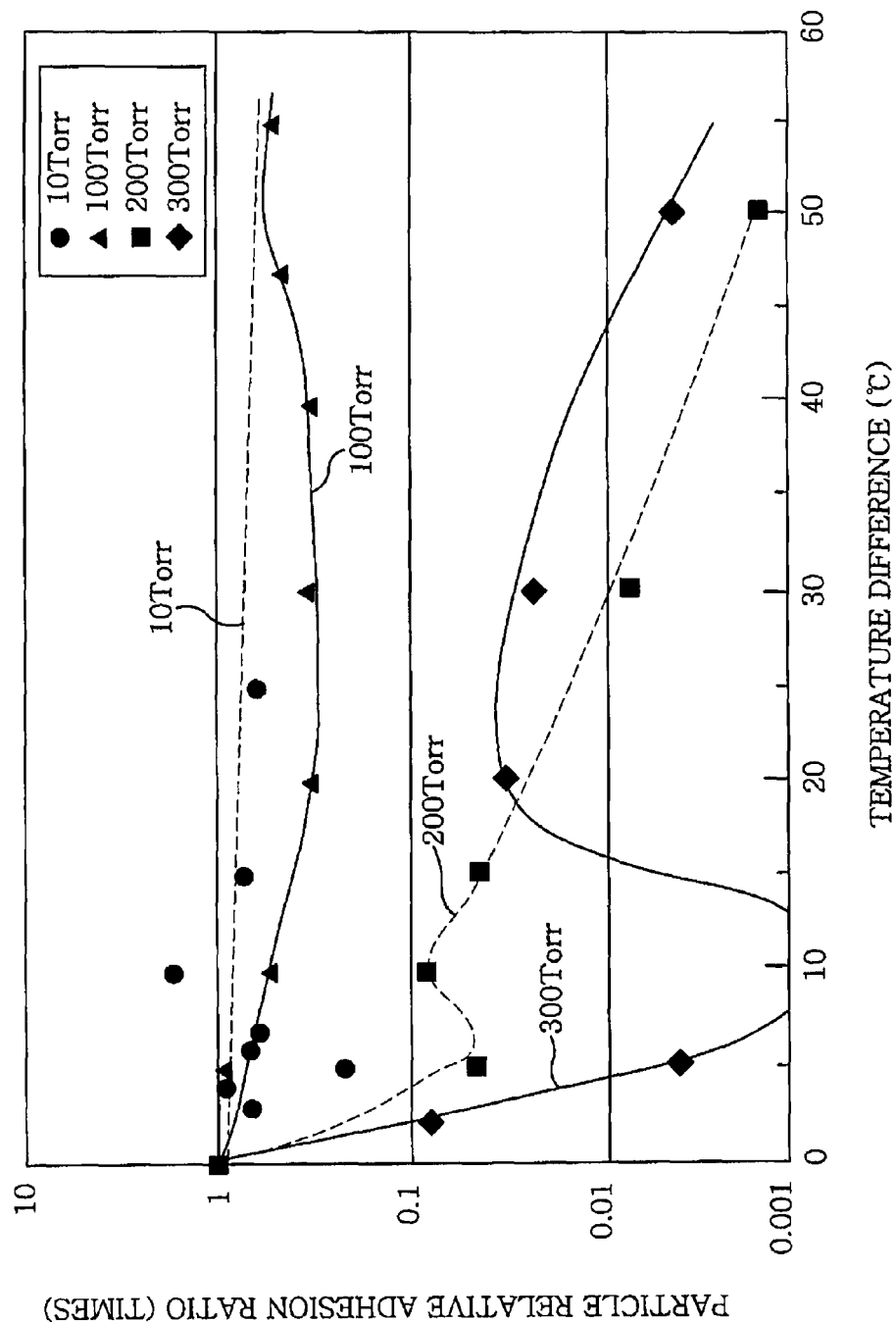
FIG. 9 illustrates a relationship between the amount of particles adhered to the surface of a wafer and the pressure of an atmosphere.

It is known that the thermophoretic force is varied in magnitude, depending on the pressure of the atmosphere. In order to identify the correlation between the thermophoretic force and the pressure of the atmosphere, a test was carried out to compare the particle adhesion amount on a wafer sample adjusted to have a temperature higher than the room temperature, with the particle adhesion amount on a wafer sample adjusted to have the room temperature, for various atmosphere pressures (10 Torr, 100 Torr, 200 Torr, and 300 Torr). Results of this test are depicted in a graph of FIG. 9. As can be seen from the test results shown in FIG. 9, when the degree of vacuum was high at the atmosphere pressure of 10 Torr or 100 Torr, the relative particle adhesion rate approximated to one time, irrespective of the temperature difference between the wafer sample adjusted to have a temperature higher than the room temperature and the wafer sample adjusted to have the room temperature. That is, there was no remarkable difference between the particle adhesion amounts on both wafer samples.

On the other hand, it can be seen that the relative particle adhesion rate was lowered when the degree of vacuum was low at the atmosphere pressure of 200 Torr or 300 Torr. In particular, it can be seen that the adhesion rate of particles on the wafer surface was considerably reduced when a temperature gradient having a temperature difference of 2° C. or more was established on the wafer surface.

Figure 10A:
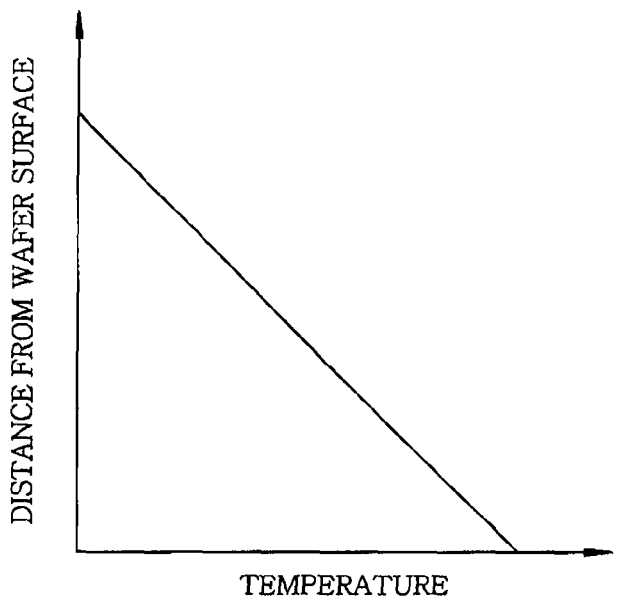
FIG. 10A conceptually illustrates a characteristic curve of a temperature gradient exhibited in an atmosphere in a vicinity of a surface of a wafer when the wafer is in a vacuum atmosphere.
Figure 10B:
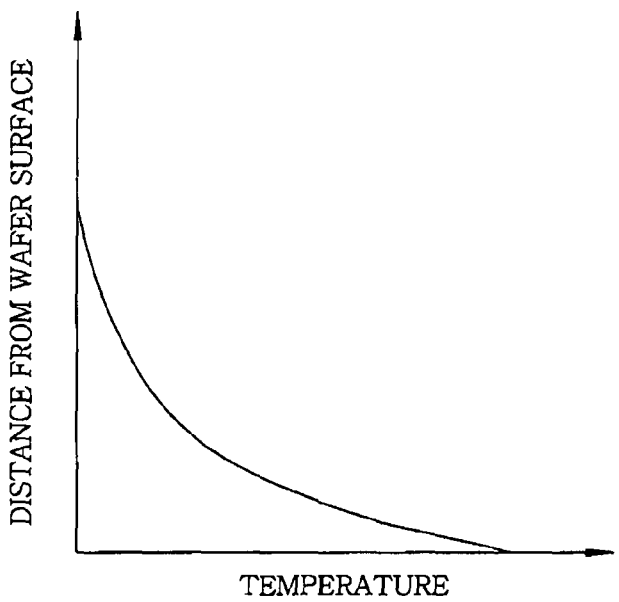
FIG. 10B conceptually illustrates a characteristic curve of a temperature gradient exhibited in an atmosphere in a vicinity of a surface of a wafer when the wafer is in an atmospheric atmosphere.

When wafers W are present in a vacuum atmosphere and an atmospheric atmosphere, respectively, the characteristic curves of temperature gradients exhibited in the atmospheres in the vicinity of the surfaces of the wafers W (e.g., within a distance range of up to about 1 cm from the surfaces of the wafers W) are considered to be approximated as shown in FIGS. 10A and 10B, respectively. Referring to the temperature gradients in the vicinity of the surfaces of the wafers W, the temperature gradient established in association with the wafer W in the vacuum atmosphere is considered to be substantially constant within a distance range of up to 1 cm from the surface of the wafer W, as shown in FIG. 10A, whereas the temperature gradient established in association with the wafer W in the atmospheric atmosphere is considered to be sharply varied just above the surface of the wafer W, as shown in FIG. 10B. Thus, the repulsive force such as thermophoretic force generated due to such a temperature gradient is conjectured to be abruptly increased at a position nearer to the surface of the wafer W in the case where the wafer W is present in the atmospheric atmosphere, compared to the case where the wafer W is present in the vacuum atmosphere.

Since the thermophoretic force generated in the atmospheric atmosphere is considered to be abruptly increased at a position nearer to the surface of the wafer W, as described above, a particle in the vicinity of the surface of the wafer W must be subjected to a force repelling the particle from the surface of the wafer W, the repelling force rapidly increasing as the particle approaches the surface of the wafer W. Consequently, when the wafer W is present in the atmospheric atmosphere, it may be possible to prevent particles from being adhered to the surface of the wafer W simply by adjusting the temperature of the wafer W to a temperature higher than the ambient temperature around the wafer W by 2 to 12° C.

As disclosed in Japanese Patent Laid-open Publication No. 2005-354025, a large amount of energy is needed to remove particles already adhered to the surface of the wafer W through a peel-off method. However, it is unnecessary to provide a large amount of thermophoretic force to prevent particles approaching the surface of the wafer W in a room having a low degree of vacuum from being adhered to the surface of the wafer W, as in this embodiment, as described above.

As described above, in accordance with the first embodiment, simply by supplying the hot air 502 to the cassette container 400 accommodating the wafer W, it is possible to increase the temperature of the wafer W to a predetermined temperature before the wafer W is loaded into a next chamber, i.e., the transfer chamber 200. Accordingly, it is possible to prevent particles from being adhered to the surface of the wafer W in the transfer chamber 200. Thus, it is possible to transfer a clean wafer W, to which no particles are adhered, to the load-lock chamber 150. Consequently, an enhancement in yield is achieved because it is possible to prevent processing failures of the wafer due to particles adhered to the wafer.

In particular, in the first embodiment, it is possible to prevent particles from being adhered to the wafer W from the moment the wafer W enters into the transfer chamber 200 because the temperature of the wafer W is increased before the wafer W is loaded into the transfer chamber 200. In the first embodiment, it is also possible to heat the wafer W by using a relatively simple configuration in which the hot air 502 is supplied to the interior of the cassette container 400 through the air holes formed at the cassette container 400.

Temperature Control Unit of Second Embodiment

Hereinafter, a temperature control unit in accordance with a second embodiment of the present invention will be described with reference to FIGS. 11 and 12. In the first embodiment, the temperature control unit that supplies the hot air 502 to the interior of the cassette container 400 through the air holes 404 has been described. However, the second embodiment employs a temperature control unit that supplies hot air to the interior of the cassette container 400 through the substrate gate 212 via an air passage formed in the transfer chamber. Hereinafter, this temperature control unit will be described.

Figure 11:
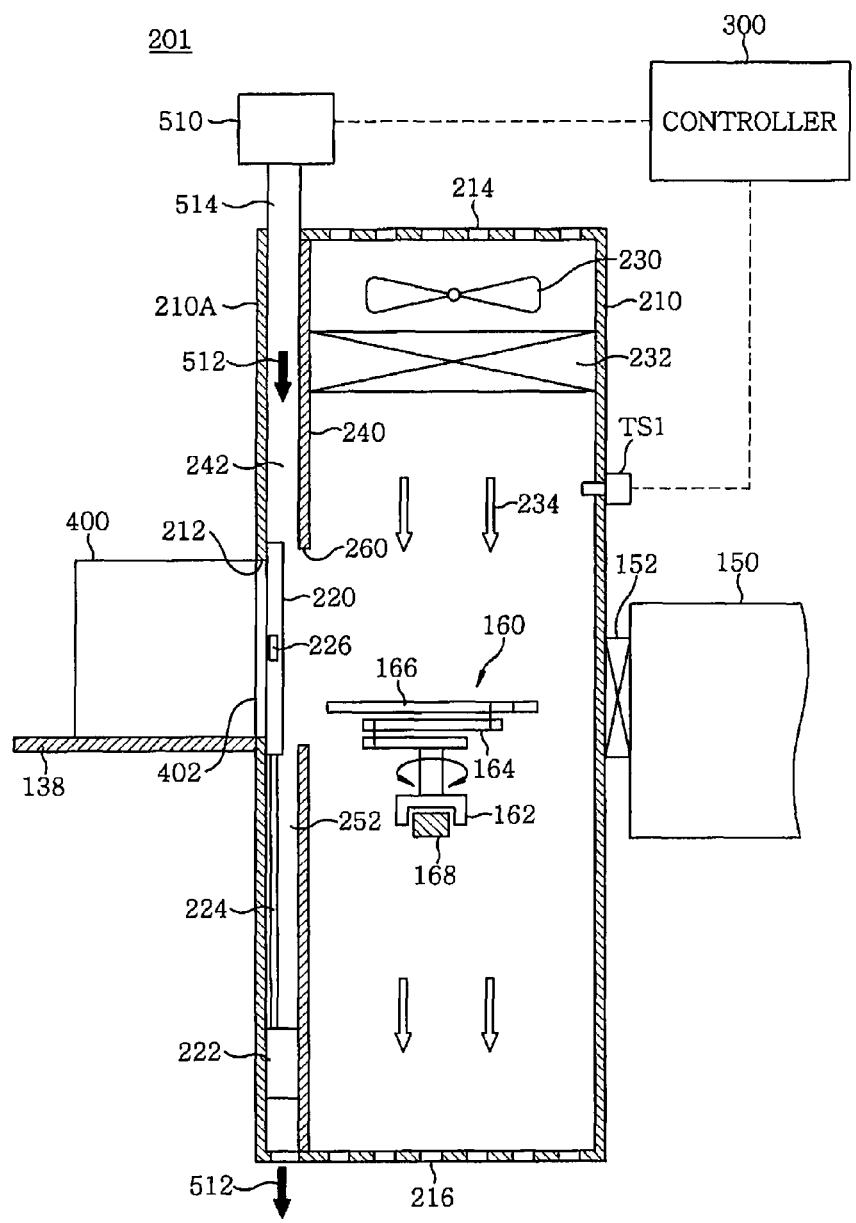
FIG. 11 is a longitudinal cross sectional view showing a schematic configuration of a transfer chamber including a temperature control unit in accordance with a second embodiment of the present invention.

FIG. 11 is a longitudinal cross sectional view showing a schematic configuration of a transfer chamber 201 including the temperature control unit in accordance with the second embodiment. FIG. 11 is a view taken from one end of the transfer chamber 201. As shown in FIG. 11, an air passage which guides hot air from a hot air supplier 510 to the substrate gate 212 is provided in the transfer chamber 201. Specifically, a partition wall 240 is provided such that it extends vertically to cover the substrate gate 212. The air passage is defined between a sidewall 210A and the partition wall 240. The partition wall 240 illustrated in FIG. 11 has an upper end extending to the ceiling portion of the housing 210, and a lower end extending to the bottom portion of the housing 210. The partition wall 240 isolates the air passage from the atmosphere of the transfer chamber 201 at the side of the load-lock chamber 150. In this embodiment, a portion of the air passage arranged above the substrate gate 212 will be referred to as an "upper air passage 242", whereas a portion of the air passage arranged below the substrate gate 212 will be referred to as a "lower air passage 252".

The partition wall 240 is opened at a portion thereof facing the substrate gate 212, to form an inner substrate gate 260. The inner substrate gate 260 is closed at the rear side of the door 220 when the lid 402 of the cassette container 400 is opened by using the door 220.

The hot air supplier 510 is connected to the upper end of the upper air passage 242 via a hot air introduction tube 514. The hot air supplier 510 generates hot air 512 of a predetermined temperature in accordance with a control signal transmitted from the controller 300, and supplies the hot air 512 to the upper air passage 242 via the hot air introduction tube 514. When the lid 402 of the cassette container 400 is opened by using the door 220, the hot air 512 from the hot air supplier 510 is supplied, and then guided to the upper air passage 242, so that it is introduced into the cassette container 400.

The hot air supplier 510 may generate the hot air 512 by heating air, and then forcing the heated air to pass through a ULPA filter. Alternatively, the hot air supplier 510 may generate the hot air 512 by heating nonreactive gas such as $N_2$ gas. In the upper air passage 242, for example, a ULPA filter may be provided.

The lower air passage 252 is connected to one of the air discharge holes 216 formed at the bottom portion of the housing 210. By the lower air passage 252, the hot air 512 flowing out from the cassette container 400 can be outwardly discharged from the transfer chamber 201 through the air discharge hole 216. In this embodiment, the door moving mechanism, which includes the actuator 222 and the retractable rod 224, may be provided in the lower air passage 252.

An air discharge fan may be provided in the lower air passage 252, to actively discharge the hot air 512 through the air discharge hole 216. When the hot air 512 is generated by heating nonreactive gas such as $N_2$ gas, a circulation passage may be provided to return the hot air 512 discharged from the air discharge hole 216 to the hot air supplier 510.

In accordance with the second embodiment, a cassette stage 138 is also provided in the transfer chamber 201. The cassette stage 138 has the same configuration as the cassette stage 132, except that the hot air supply port 134 and the hot air discharge port 136 are omitted.

Figure 12:
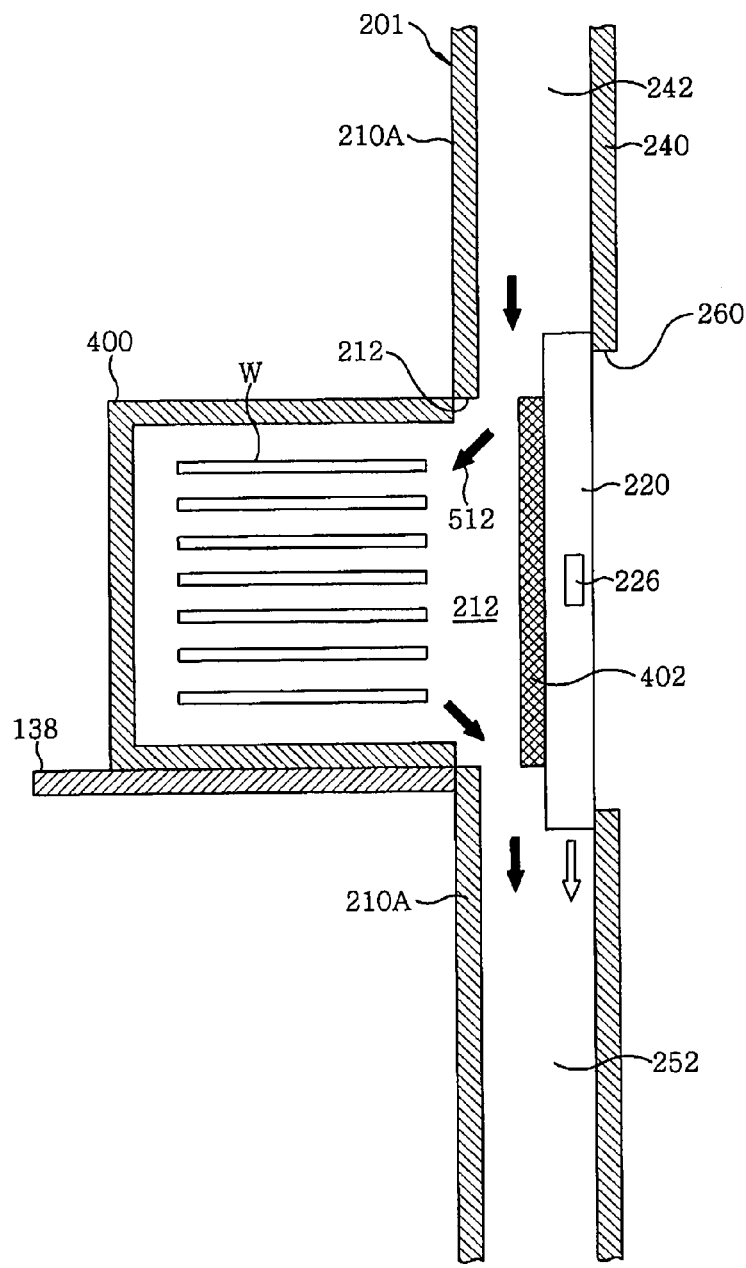
FIG. 12 is an enlarged view illustrating a vicinity of a substrate gate of the transfer chamber in accordance with the second embodiment of the present invention.

In the transfer chamber 201 illustrated in FIG. 11, when the door 220 and the lid 402 move toward the inside of the transfer chamber 201 such that the door 220 closes the inner substrate gate 260 at the rear side of the door 220, the air passage (the upper air passage 242 and the lower air passage 252) is completely isolated from the atmosphere of the transfer chamber 201 at the side of the load-lock chamber 150, as shown in FIG. 12.

When the hot air 512 is supplied from the hot air supplier 510 in this state, it is guided by the upper air passage 242 and then introduced into the cassette container 400 through the substrate gate 212. That is, when the lid 402 of the cassette container 400 is opened, as shown in FIG. 12, a gap is formed between the cassette container 400 and the lid 402, so that the hot air 512 guided by the upper air passage 242 is introduced into the cassette container 400 through the gap.

Thereafter, the hot air 512 filled in the cassette container 400 flows into the lower air passage 252 through the gap between the cassette container 400 and the lid 402. The hot air 512 is then outwardly discharged from the transfer chamber 201 through the air discharge holes 216. Thus, each wafer W in the cassette container 400 is heated by the hot air 512 introduced into the cassette container 400.

During the supply of the hot air 512, the inner substrate gate 260 is closed by the door 220, as described above. Accordingly, there is no occasion that the hot air 512 introduced into the cassette container 400 flows into a space of the transfer chamber 201 where the downflow 234 is formed. As a result, there is no increase in the internal temperature of the transfer chamber 201 caused by the supply of the hot air 512.

After a predetermined time elapses, the supply of the hot air 512 from the hot air supplier 510 is stopped. At this time, the temperature of each wafer W in the cassette container 400 is expected to have been increased to a temperature higher than the internal temperature of the transfer chamber 201 by a predetermined temperature (e.g., 3° C.). Subsequently, the door 220 and lid 402 are downwardly moved by the retractable rod 224, thereby opening the inner substrate gate 260. Thus, the substrate gate 212 and the inner substrate gate 260 are opened (communicate with each other), to allow a wafer W to be taken out of the cassette container 400. The transfer mechanism 160 takes a wafer W, to be processed, out of the cassette container 400, and then loads the wafer W into a next chamber, namely, the transfer chamber 201, as in the first embodiment.

As described above, in accordance with the second embodiment, it is possible to increase the temperature of the wafer W by a predetermined temperature before loading the wafer W into the transfer chamber 201, by supplying the hot air 512 to the cassette container 400, in which the wafer W is accommodated, through the substrate gate 212. Accordingly, it is possible to prevent particles from being adhered to the surface of the wafer W in the transfer chamber 201, as in the first embodiment.

When a plurality of cassette stages 138 (see the cassette stages 132A to 132C of FIG. 1) are provided in the transfer chamber 201 and a plurality of substrate gates 212 corresponding to the respective cassette stages 138 are also provided, one partition wall 240 may be provided to cover all the substrate gates 212. Alternatively, a plurality of partition walls 240 may be provided for the respective substrate gates 212. In the latter case, one air passage (one upper air passage 242 and one lower air passage 252) may be defined by each partition wall 240. When one air passage is provided for each substrate gate 212, it is possible to efficiently heat wafers W in each of the cassette containers 400 (400A to 400C) by using a minimum flow rate of the hot air 512.

Temperature Control Unit of Third Embodiment

Hereinafter, a temperature control unit in accordance with a third embodiment of the present invention will be described with reference to FIGS. 13 and 14. In the second embodiment, the case, in which the door moving mechanism including the actuator 222 and the retractable rod 224 is provided in the air passage, has been described. However, the third embodiment employs a door moving mechanism provided at the outside of the air passage. Hereinafter, this configuration will be described.

Figure 13:
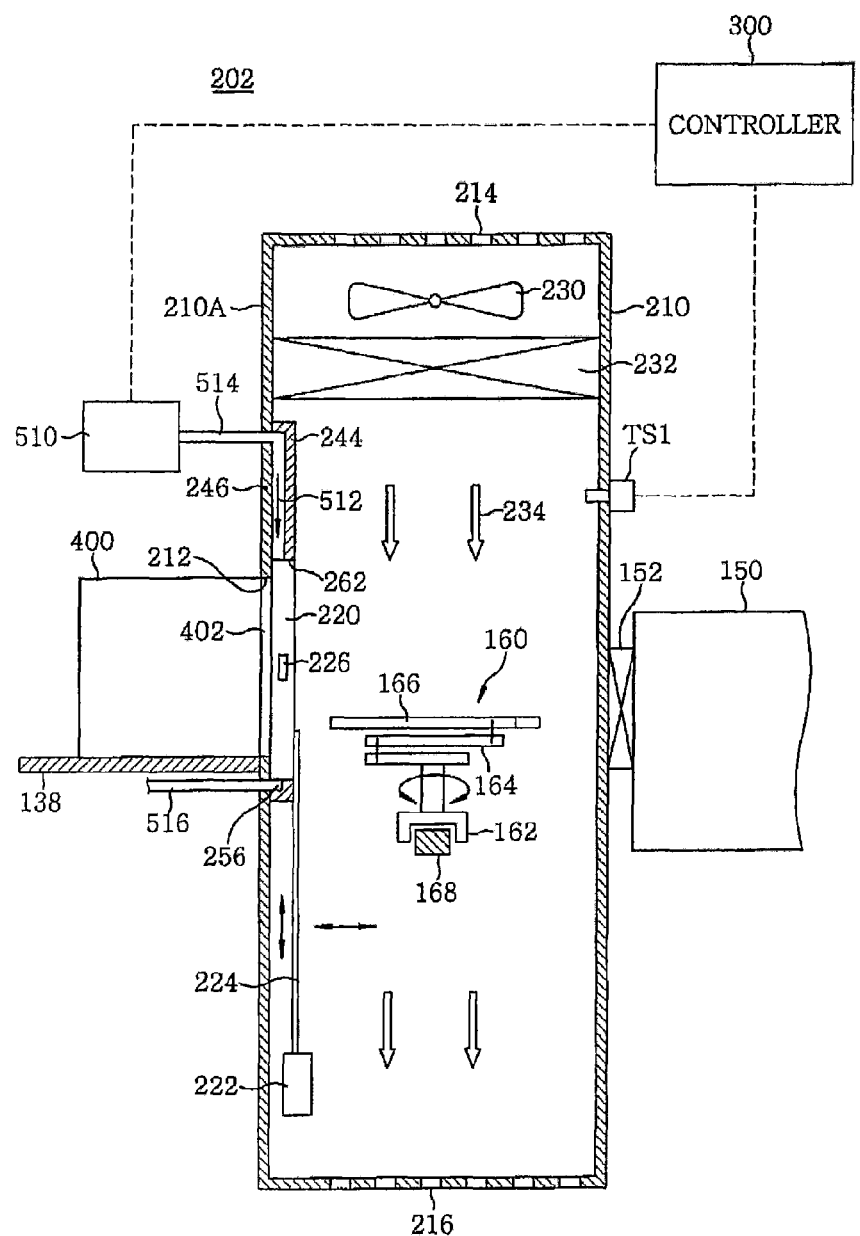
FIG. 13 is a longitudinal cross sectional view showing a schematic configuration of a transfer chamber including a temperature control unit in accordance with a third embodiment of the present invention.
Figure 14:
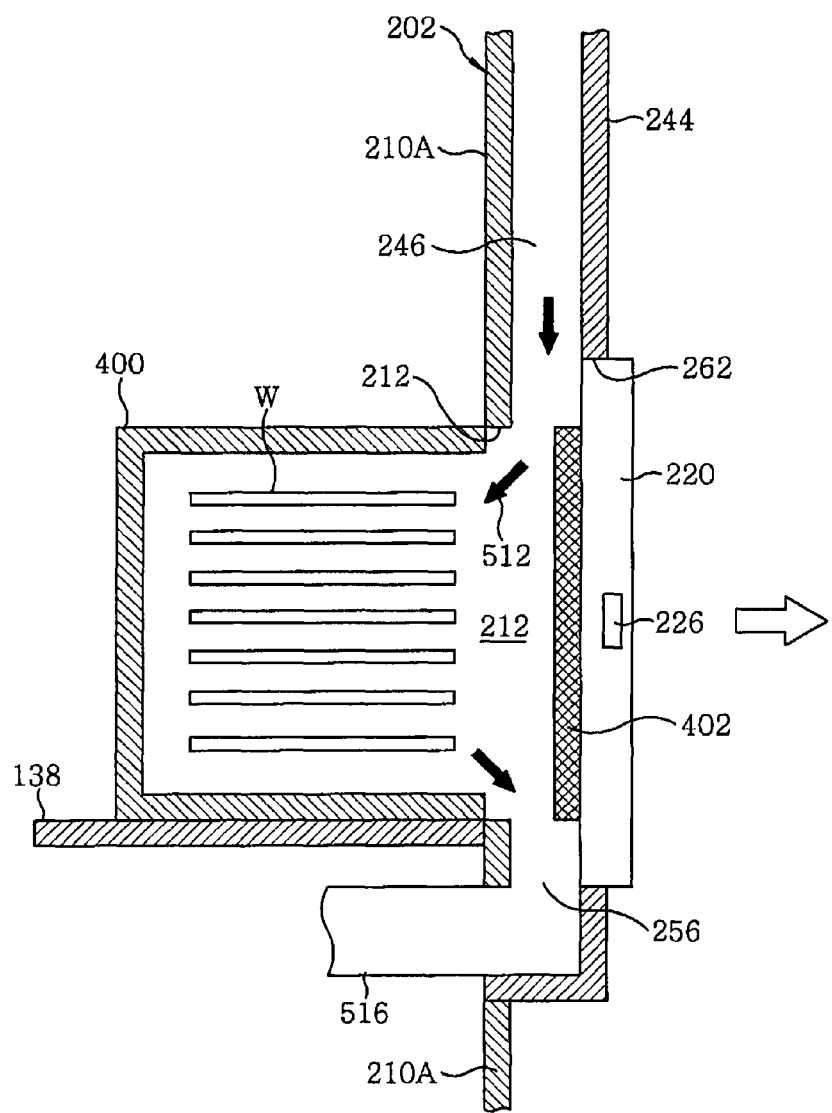
FIG. 14 is an enlarged view illustrating a vicinity of a substrate gate of the transfer chamber in accordance with the third embodiment of the present invention.

FIG. 13 is a longitudinal cross sectional view showing a schematic configuration of a transfer chamber 202 including a temperature control unit in accordance with the third embodiment. FIG. 13 is a view taken from one end of the transfer chamber 202. FIG. 13 illustrates a partition wall 244 extending downwardly from a certain position below the air filter 232, to cover at least the upper end of the substrate gate 212. The partition wall 244 further extends to a certain position below the lower end of the substrate gate 212. In this embodiment, in the air passage defined by the partition wall 244, a portion arranged above the substrate gate 212 will be referred to as an "upper air passage 246", and a portion arranged below the substrate gate 212 will be referred to as a "lower air passage 256".

The partition wall 244 is opened at a portion thereof facing the substrate gate 212, to form an inner substrate gate 262. The inner substrate gate 262 is closed by the door 220.

As shown in FIG. 13, the hot air supplier 510 is connected to the upper air passage 246 via a hot air introduction tube 514 extending through the sidewall 210A. Accordingly, when the lid 402 of the cassette container 400 is opened by the door 220, the hot air 512 from the hot air supplier 510 is supplied, and then guided to the upper air passage 246, so that it is introduced into the cassette container 400.

A hot air discharge tube 516, which extends through the sidewall 210A, is connected to the lower air passage 256. Accordingly, the hot air 512 flowing out from the cassette container 400 can be outwardly discharged from the transfer chamber 202 through the hot air discharge tube 516 after passing through the lower air passage 256.

An air discharge fan may be provided in the lower air passage 256, to actively discharge the hot air 512. When the hot air 512 is generated by heating inert gas such as $N_2$ gas, a circulation passage may be connected to the hot air discharge tube 516, to return the discharged hot air 512 to the hot air supplier 510.

In the transfer chamber 202 illustrated in FIG. 13, the door 220 and the lid 402 move toward the inside of the transfer chamber 202 such that the door 220 closes the inner substrate gate 262. In this state, the air passage (the upper air passage 246 and the lower air passage 256) is completely isolated from the atmosphere of the transfer chamber 202 at the side of the load-lock chamber 150, as shown in FIG. 14.

When the hot air 512 is supplied from the hot air supplier 510 in this state, it is guided by the upper air passage 246 and then introduced into the cassette container 400 through the substrate gate 212. That is, when the lid 402 of the cassette container 400 is opened, as shown in FIG. 14, a gap is formed between the cassette container 400 and the lid 402, so that the hot air 512 guided by the upper air passage 246 is introduced into the cassette container 400 through the gap.

Thereafter, the hot air 512 filled in the cassette container 400 flows into the lower air passage 256 through the gap between the cassette container 400 and the lid 402. The hot air 512 is then outwardly discharged from the transfer chamber 202 through the air discharge tube 516. Thus, each wafer W in the cassette container 400 is heated by the hot air 512 introduced into the cassette container 400.

Also in the third embodiment, the inner substrate gate 262 is closed by the door 220 during the supply of the hot air 512, as described above, similarly to the second embodiment. Accordingly, there is no occasion that the hot air 512 introduced into the cassette container 400 flows into a space of the transfer chamber 202 where the downflow 234 is formed. As a result, there is no increase in the internal temperature of the transfer chamber 202 caused by the supply of the hot air 512.

After a predetermined time elapses, the supply of the hot air 512 from the hot air supplier 510 is stopped. At this time, the temperature of each wafer W in the cassette container 400 is expected to have been increased to a temperature higher than the internal temperature of the transfer chamber 202 by a predetermined temperature (e.g., 3° C.). Subsequently, the door 220 and the lid 402 are moved in a horizontal direction toward the inside of the transfer chamber 202 by using the retractable rod 224 such that they are horizontally spaced away from the inner substrate gate 262 and, then, they are downwardly moved, thereby opening the inner substrate gate 262. Thus, the substrate gate 212 and the inner substrate gate 262 are opened (communicate with each other), to allow a wafer W to be taken out of the cassette container 400. The transfer mechanism 160 takes a wafer W, to be processed, out of the cassette container 400, and then loads the wafer W into a next chamber, namely, the transfer chamber 202, as in the first embodiment.

As described above, in accordance with the third embodiment, it is possible to increase the temperature of the wafer W by a predetermined temperature (e.g., 3° C.) before loading the wafer W into the transfer chamber 202, by supplying the hot air 512 to the cassette container 400, in which the wafer W is accommodated, through the substrate gate 212, as in the second embodiment. Accordingly, it is possible to prevent particles from being adhered to the surface of the wafer W in the transfer chamber 202, as in the first embodiment.

The air passage in accordance with the third embodiment may have a short length only sufficient to cover a range from the upper end of the substrate gate 212 to the lower end of the substrate gate 212. Accordingly, it is possible to efficiently supply the hot air 512.

In the third embodiment, when a plurality of cassette stages 138 (see the cassette stages 132A to 132C of FIG. 1) are provided in the transfer chamber 202 and a plurality of substrate gates 212 corresponding to the respective cassette stages 138 are provided, one partition wall 244 may be provided to cover all the substrate gates 212, as in the second embodiment. Alternatively, a plurality of partition walls 244 may be provided for the respective substrate gates 212. In the latter case, one air passage (one upper air passage 246 and one lower air passage 256) may be defined by each partition wall 244. When one air passage is provided for each substrate gate 212, it is possible to efficiently heat wafers W in each of the cassette containers 400 (400A to 400C) by using a minimum flow rate of the hot air 512.

In the third embodiment, the hot air 512 introduced into the cassette container 400 is outwardly discharged from the transfer chamber 202 via the lower air passage 256. Alternatively, when an air hole (not shown) is formed through the cassette container 400, the hot air 512 may be discharged through the air hole. When the air hole is formed at the bottom portion of the cassette container 400, a hot air discharge port communicating with the air hole may be provided at the cassette stage 138, similarly to the hot air discharge port 136 of the cassette stage 132 in the first embodiment. In accordance with this configuration, it is also possible to efficiently heat wafers W contained in the cassette container 400.

Temperature Control Unit of Fourth Embodiment

Hereinafter, a temperature control unit in accordance with a fourth embodiment of the present invention will be described with reference to FIGS. 15 and 16. In the first to third embodiments, the temperature control unit that heats wafers W by supplying hot air to the interior of the cassette container 400 has been described. However, the fourth embodiment employs the temperature control unit to heat wafers W by light. Hereinafter, this temperature control unit will be described.

Figure 15:
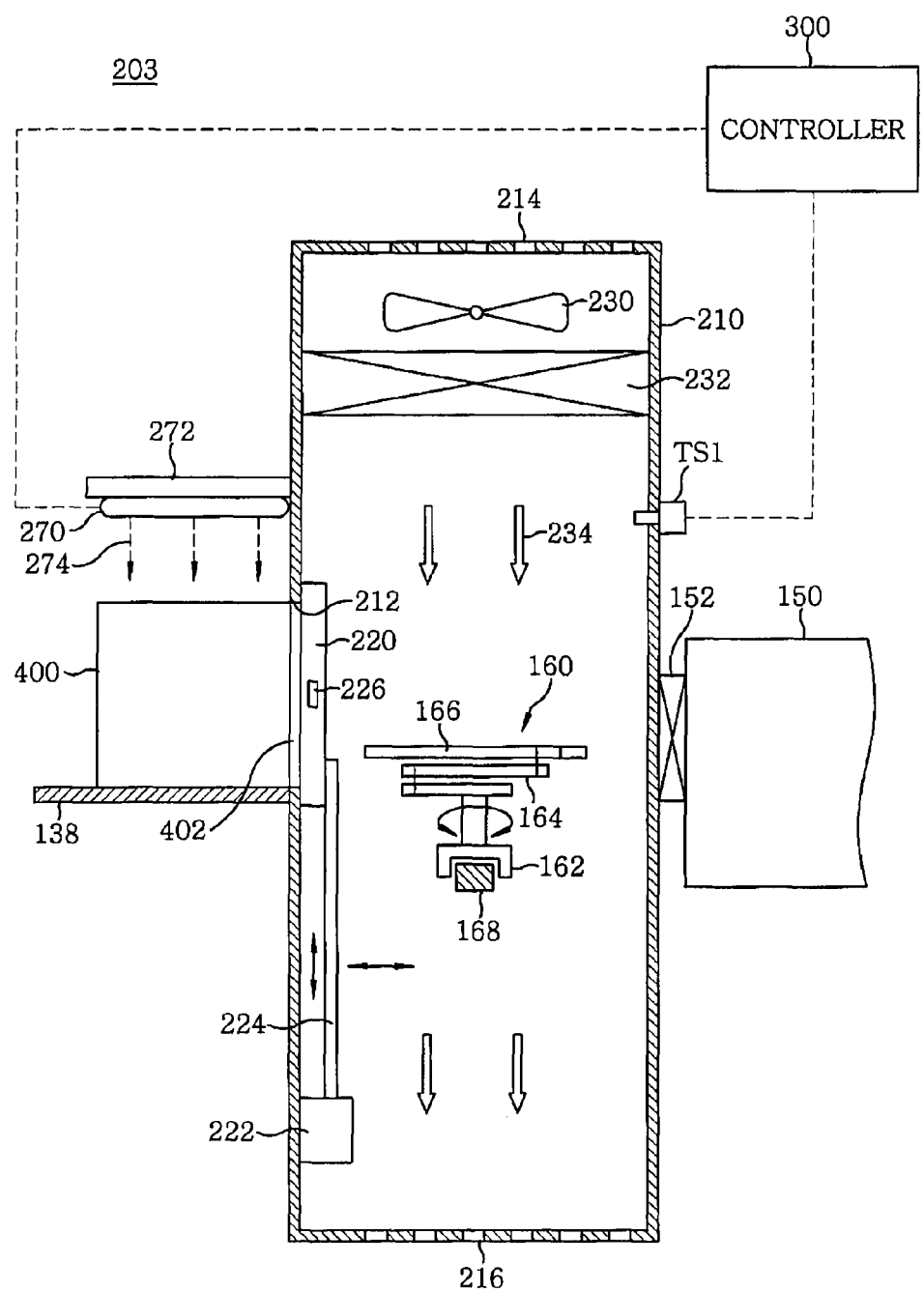
FIG. 15 is a longitudinal cross sectional view showing a schematic configuration of a transfer chamber including a temperature control unit in accordance with a fourth embodiment of the present invention.

FIG. 15 is a longitudinal cross sectional view showing a schematic configuration of a transfer chamber 203 including the temperature control unit in accordance with the fourth embodiment. FIG. 15 is a view taken from one end of the transfer chamber 203. As shown in FIG. 15, the transfer chamber 203 in accordance with the fourth embodiment includes a light irradiator 270 arranged above the cassette stage 138, and a blanket 272 arranged to fix the light irradiator 270 to the housing 210 of the transfer chamber 203. The light irradiator 270 emits light 274 having a predetermined wavelength at a predetermined power in accordance with a control signal transmitted from the controller 300.

Figure 16:
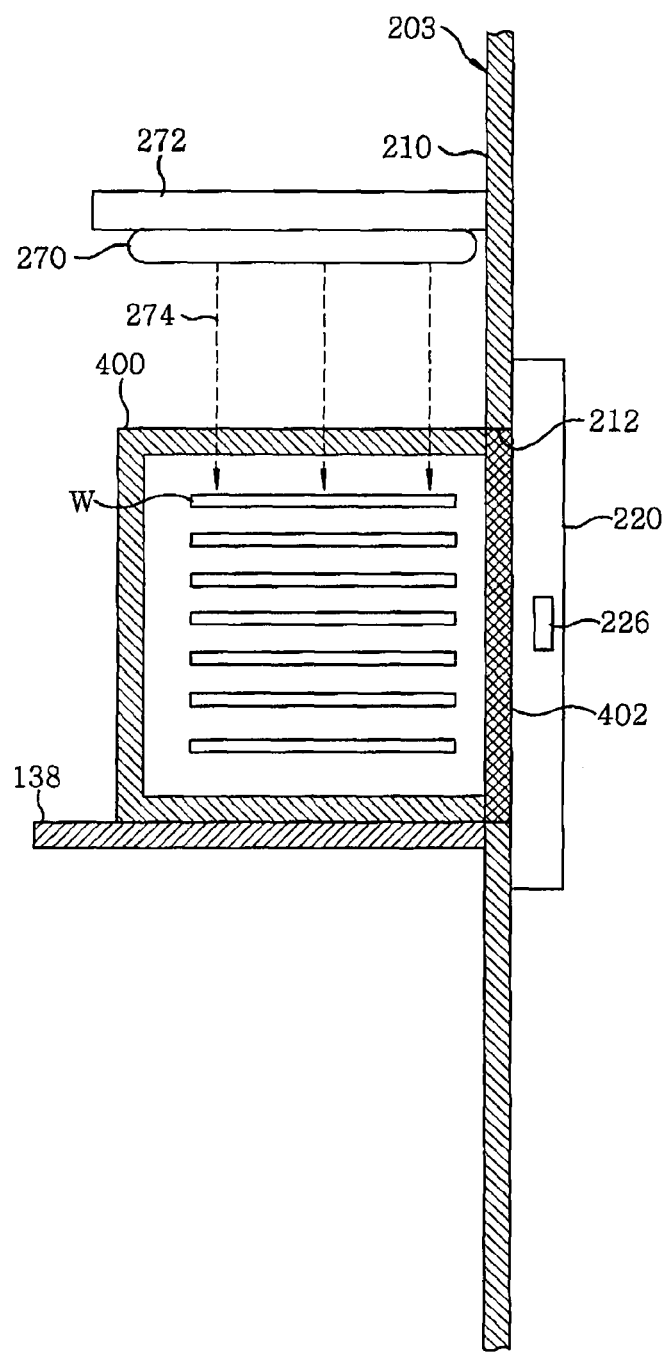
FIG. 16 is an enlarged view of a light irradiator and cassette container in accordance with the fourth embodiment of the present invention.

FIG. 16 is an enlarged view of the light irradiator 270 and the cassette container 400 in accordance with the fourth embodiment. As shown in FIG. 16, the blanket 272 is adhered to the housing 210, to allow the light 274 emitted from the light irradiator 270 to be irradiated to an upper surface of the cassette container 400.

The light irradiator 270 is configured as, e.g., a light source to irradiate, as the light 274, heat rays (e.g., near infrared rays) capable of generating a heat effect by being absorbed into a material of the wafer W, i.e., silicon. In this case, the entire portion of the cassette container 400, or an upper surface portion of the cassette container 400, to which the light 274 is irradiated, is made of a material allowing near infrared rays to pass therethrough. Accordingly, the light 274 reaches the wafer W after passing through the wall of the cassette container 400, so that it is absorbed into the wafer W. As a result, the wafer W is heated. After a certain time elapses, the temperature of the wafer W is increased to a temperature higher than the internal temperature of the transfer chamber 203 by a predetermined temperature (e.g., 3° C.). The light irradiator 270, the temperature sensor TS1 and the controller 300 are included in the temperature control unit to adjust the temperature of the wafer W in the cassette container 400 based on the internal temperature of the transfer chamber 203.

When the light irradiator 270 is arranged above the cassette container 400, as shown in FIG. 16, an uppermost one of the wafers W in the cassette container 400 is heated first. Accordingly, it is desirable to sequentially take the wafers W out of the cassette container 400, starting from the uppermost wafer W. In accordance with the material of the wafers W, the light irradiator 270 may be a light source to irradiate, as the light 274, light having a wavelength different from that of the above-described light source. Also, the light irradiator 270 may heat, e.g., the cassette container 400, so as to indirectly heat the wafers W. In this case, a light source for irradiating, as the light 274, far infrared rays, visible light, or light of other wavelengths may be used as the light irradiator 270.

As described above, in accordance with the fourth embodiment, it is possible to efficiently heat wafers W contained in the cassette container 400 by irradiating the light 274 such as heat rays to the cassette container 400. Since the heating of the wafers W can be achieved while the lid 402 of the cassette container 400 is closed, it is possible to increase the temperature of the wafer W by a predetermined temperature before loading the wafer W into the transfer chamber 203. Accordingly, it is possible to prevent particles from being adhered to the surface of the wafer W in a next chamber, namely, the transfer chamber 203, as in the first embodiment.

Temperature Control Unit of Fifth Embodiment

Hereinafter, a temperature control unit in accordance with a fifth embodiment of the present invention will be described with reference to FIG. 17. In the first to third embodiments, the temperature control unit for heating wafers W by supplying hot air to the interior of the cassette container 400 has been described. Also, in the fourth embodiment, the temperature control unit for heating wafers W by irradiating light to the cassette container 400 has been described. However, the fifth embodiment employs a temperature control unit for heating a wafer W by heating a pick 166 of the transfer mechanism 160. Hereinafter, this temperature control unit will be described.

Figure 17:
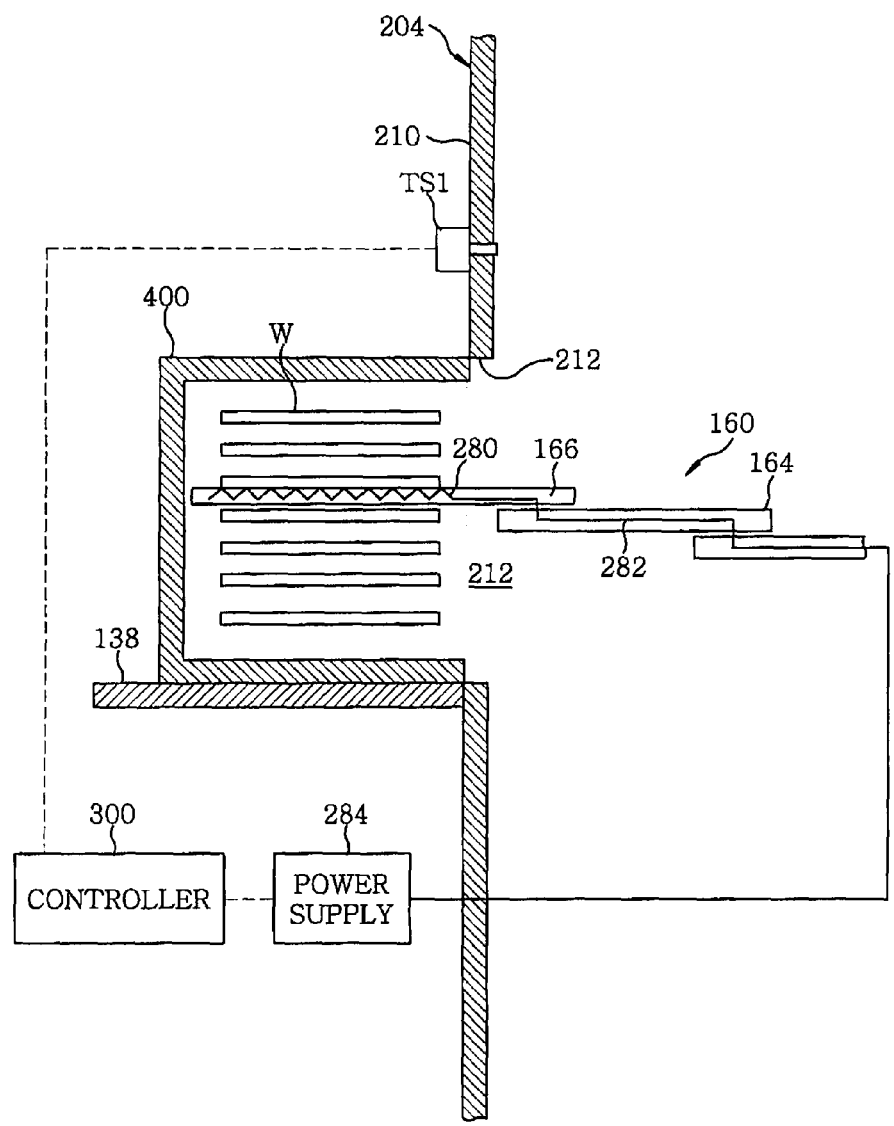
FIG. 17 is a view illustrating an inner structure of a pick in accordance with a fifth embodiment of the present invention.

FIG. 17 illustrates an inner structure of the pick 166 in accordance with the fifth embodiment. FIG. 17 shows a state in which the pick 166 is introduced into the cassette container 400, to take a wafer W out of the cassette container 400.

As shown in FIG. 17, a heating element 280, as an example of a heater, is embedded in the pick 166. The heating element 280 is connected to a power supply 284 via a power supply line 282 embedded in a multi-joint arm 164. The power supply 284 supplies a predetermined power to the heating element 280 via the power supply line 282 in accordance with a control signal transmitted from the controller 300. Accordingly, the pick 166 is heated, thereby heating a wafer W held by the pick 166. The power supply 284, the power supply line 282, the heating element 280, the temperature sensor TS1 and the controller 300 are included in the temperature control unit to adjust the temperature of wafers W contained in the cassette container 400 based on the internal temperature of a transfer chamber 204.

In the fifth embodiment, the pick 166 is heated while it holds a wafer W after it enters the cassette container 400, to take the wafer W out of the cassette container 400. As a result, the wafer W held by the pick 166 is heated. Accordingly, the temperature of the wafer W can be increased to be higher than the internal temperature of the transfer chamber 204 by a predetermined temperature (e.g., 3° C.). After the wafer W is heated to a predetermined temperature, the application of the power to the heating element 280 is stopped. That is, the heating of the pick 166 is stopped. The multi-joint arm 164 is then retracted to take the wafer W out of the cassette container 400. When the wafer W is taken out, the application of power may be continued. In this case, the power may be applied at a level sufficient to prevent a decrease in the temperature of the heated wafer W.

As described above, in accordance with the fifth embodiment, it is possible to increase the temperature of a wafer W by a predetermined temperature just before the wafer W is loaded into a next chamber, namely, the transfer chamber 204, by heating the pick 166 when the pick 166 enters the cassette container 400, to take the wafer W out of the cassette container W. Accordingly, it is possible to prevent particles from being adhered to the surface of the wafer W in the transfer chamber 204, as in the first embodiment.

In accordance with the fifth embodiment, it is also possible to heat only the wafer W currently introduced into the transfer chamber 204 among a plurality of wafers W contained in the cassette container 400. Accordingly, it is possible to prevent particles from being adhered to the surface of the wafer W by heating the wafer W to a predetermined temperature while using less energy.

Temperature Control Unit of Sixth Embodiment

Hereinafter, a temperature control unit in accordance with a sixth embodiment of the present invention will be described with reference to FIG. 18. In each of the first to fifth embodiments, the temperature control unit that adjusts the temperature of a wafer W to be higher than the internal temperature of each of the transfer chambers 200 to 204 by heating the wafer W in the cassette container 400 has been described. However, the sixth embodiment employs a temperature control unit to adjust the temperature of the wafer W to be higher than the internal temperature of the transfer chamber by cooling the atmosphere of the transfer chamber, contrary to the previous embodiments. Hereinafter, this temperature control unit will be described.

Figure 18:
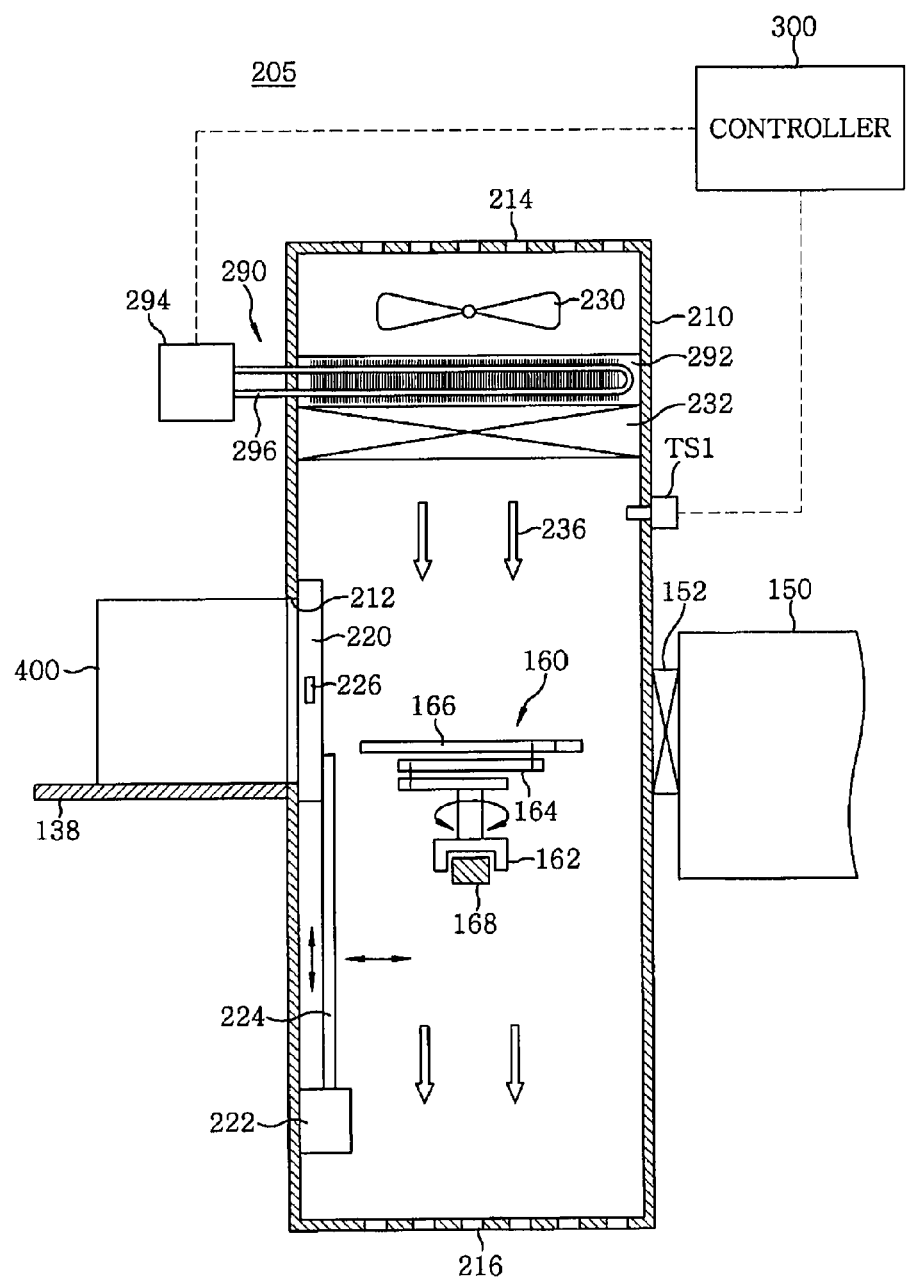
FIG. 18 is a longitudinal cross sectional view showing a schematic configuration of a transfer chamber including a temperature control unit in accordance with a sixth embodiment of the present invention.

FIG. 18 is a longitudinal cross sectional view showing a schematic configuration of a transfer chamber 205 including the temperature control unit in accordance with the sixth embodiment. FIG. 18 is a view taken from one end of the transfer chamber 205. The temperature control unit in accordance with this embodiment includes a downflow cooling unit 290 serving as a cool air supplier to adjust the internal temperature of the transfer chamber 205 by supplying, to the transfer chamber 205, cool air adjusted to have a temperature lower than the temperature of wafers W in the cassette container 400.

The downflow cooling unit 290 includes an air supply fan 230 serving as an air supplier to introduce exterior air into the transfer chamber 205, and a cooler to generate cool air by cooling the exterior air introduced by the air supply fan 230. The cooler includes, e.g., an indoor heat exchanger 292 arranged between the air supply fan (air supplier) 230 and the air filter 232, an outdoor heat exchanger 294, and a refrigerant tube 296 that circulates a refrigerant between the inner heat exchanger 292 and the outdoor heat exchanger 294.

The downflow cooling unit 290 can adjust the temperature of a downflow 236 by changing heat exchange efficiency in accordance with the control signal transmitted from the controller 300. The downflow cooling unit 290, the temperature sensor TS1 and the controller 300 are included in the temperature control unit to adjust the internal temperature of the transfer chamber 205 based on the temperature of wafers W contained in the cassette container 400.

In accordance with the sixth embodiment, the atmosphere of the transfer chamber 205 is cooled by the downflow 236 cooled by the downflow cooling unit 290. Accordingly, the internal temperature of the transfer chamber 205 can be adjusted such that the temperature of the wafer W loaded into the transfer chamber 205 is higher than the temperature of the transfer chamber 205 by a predetermined temperature (e.g., 3° C.). Since the wafer W is maintained at a temperature higher than the internal temperature of the transfer chamber 205 when it is loaded from the cassette container 400 into a next chamber, namely, the transfer chamber 205, in accordance with the above-described temperature adjustment, it is possible to prevent particles from being adhered to the surface of the wafer W in the transfer chamber 205.

In accordance with the sixth embodiment, it is unnecessary to heat the wafer W. Accordingly, it is possible to prevent the adhesion of particles not only for the wafer W loaded from the cassette container 400 into the transfer chamber 205, but also the processed wafer W loaded from the load-lock chamber 150 into the transfer chamber 205, so long as there is a predetermined temperature difference between the wafer W and the transfer chamber 205.

The temperature control unit of the present invention may be configured by combining the configuration of the temperature control unit in accordance with the sixth embodiment with the configuration of the temperature control unit in accordance with one of the first to fifth embodiments. In this case, it is possible to more accurately adjust the difference between the temperature of the wafer W and the internal temperature of the transfer chamber because both the temperature of the wafer W and the internal temperature of the transfer chamber can be adjusted.

Temperature Control Unit of Seventh Embodiment

Hereinafter, a temperature control unit in accordance with a seventh embodiment of the present invention will be described with reference to FIG. 19. In each of the first to fifth embodiments, the temperature control unit that heats a wafer W in the cassette container 400 before loading the wafer W into a next chamber, i.e., the transfer chamber 200 which is located next to the cassette container 400 in a transfer direction of the wafer W, has been described. However, the seventh embodiment employs a temperature control unit to heat a wafer W in a receiving chamber connected to the transfer chamber 200 before loading the wafer W into a next chamber, i.e., the transfer chamber 200 which is located next to the receiving chamber in a transfer direction of the wafer W. Hereinafter, this temperature control unit will be described.

The receiving chamber may have various shapes and functions, so long as it is connected to the transfer chamber 200, to receive a wafer W. In this embodiment, an example, in which a position aligning chamber, e.g., the orienter, for performing position alignment on a wafer W is applied to the receiving chamber, will be described.

Figure 19:
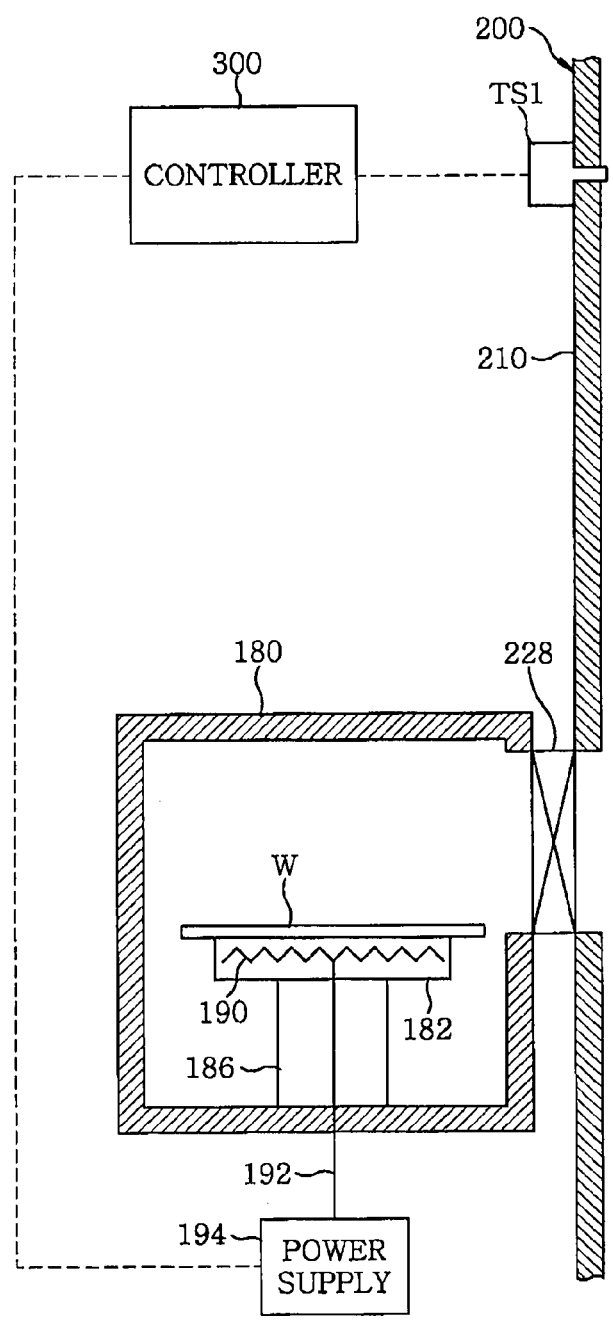
FIG. 19 is a longitudinal cross sectional view showing a schematic configuration of an orienter in accordance with a seventh embodiment of the present invention.

FIG. 19 is a longitudinal cross sectional view showing a schematic configuration of the orienter 180 in accordance with the seventh embodiment. FIG. 19 shows a state in which a wafer W is placed on the rotation table 182. In FIG. 19, the optical sensor 184 shown in FIG. 1 is omitted. As shown in FIG. 19, a heating element 190 is embedded in the rotation table 182 provided in the orienter 180, and the heating element 190 serves as a heater to adjust the temperature of the wafer W by heating the rotation table 182.

The heating element 190 is connected to a power supply 194 via a power supply line 192 embedded in a support 186. The power supply 194 supplies a predetermined power via the power supply line 192 in accordance with a control signal transmitted from the controller 300. The power supply 194, the power supply line 192, the heating element 190, the temperature sensor TS1 and the controller 300 are included in the temperature control unit to adjust the temperature of a wafer W placed on the rotation table 182 in accordance with the internal temperature of the transfer chamber 200.

In accordance with the orienter 180 of the seventh embodiment, it is possible to heat a wafer W such that the temperature of the wafer W is higher than the internal temperature of the transfer chamber 200 by a predetermined temperature (e.g., 3° C.) by heating the rotation table 182 in a state in which the wafer W is placed on the rotation table 182, for position alignment thereof. Accordingly, it is possible to prevent particles from being adhered to the surface of the position-aligned wafer W in a next chamber, namely, the transfer chamber 200, after the wafer W is again loaded into the transfer chamber 200.

In accordance with the seventh embodiment, it is possible to heat the wafer W while performing position alignment on the wafer W in the orienter 180. Thus, an enhancement in throughput is achieved, compared to the case in which the heating and position alignment are performed separately.

The temperature control unit of the present invention may be configured by combining the configuration of the temperature control unit in accordance with the seventh embodiment with the configuration of the temperature control unit in accordance with one of the first to sixth embodiments. In this case, for example, even when the temperature of the wafer W has already been adjusted by using, e.g., hot air in the cassette container 400, it is possible to re-adjust the temperature of the wafer W in the orienter 180. Thus, it is possible to more securely maintain the temperature of the wafer W until the wafer W is transferred to the load-lock chamber 150.

Temperature Control Unit of Eighth Embodiment

Hereinafter, a temperature control unit in accordance with an eighth embodiment of the present invention will be described with reference to FIG. 20. In the seventh embodiment, the temperature control unit that heats a wafer W by heating the rotation table 182 has been described. However, the eighth embodiment employs the temperature control unit to heat a wafer W in the orienter 180 by light. Hereinafter, this temperature control unit will be described.

Figure 20:
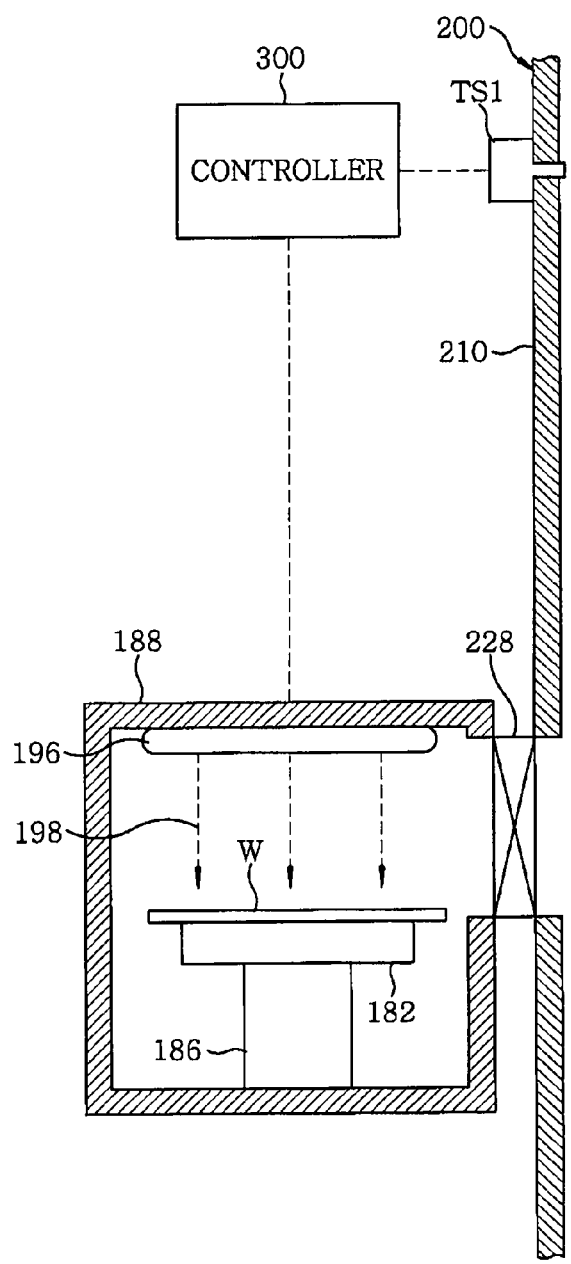
FIG. 20 is a longitudinal cross sectional view showing a schematic configuration of an orienter in accordance with an eighth embodiment of the present invention.

FIG. 20 is a longitudinal cross sectional view showing a schematic configuration of the orienter 188 in accordance with the eighth embodiment. FIG. 20 shows a state in which a wafer W is placed on the rotation table 182. In FIG. 20, the optical sensor 184 shown in FIG. 1 is omitted. As shown in FIG. 20, the orienter 188 includes a light irradiator 196.

The light irradiator 196 emits light 198 having a predetermined wavelength at a predetermined power level in accordance with a control signal transmitted from the controller 300. The light irradiator 196 is adhered to the ceiling portion of the housing of the orienter 188, to irradiate the light 198 to the surface of the wafer W on the rotation table 182. A light source which irradiates, as the light 198, near infrared rays capable of being absorbed into the wafer W may be used as the light irradiator 196. The light irradiator 196, the temperature sensor TS1 and the controller 300 are included in the temperature control unit to adjust the temperature of the wafer W placed on the rotation table 182 in accordance with the internal temperature of the transfer chamber 200.

In the orienter 188 in accordance with the eighth embodiment, when a wafer W is placed on the rotation table 182, for position alignment thereof, the light 198 is irradiated to the wafer W, thereby heating the wafer W such that the temperature of the wafer W is higher than the internal temperature of the transfer chamber 200 by a predetermined temperature (e.g., 3° C.). Accordingly, it is possible to prevent particles from being adhered to the surface of the position-aligned wafer W in a next chamber, namely, the transfer chamber 200, after the wafer W is again loaded into the transfer chamber 200.

Further, in accordance with the eighth embodiment, it is possible to heat the wafer W simply by installing the light irradiator 196 in the housing of the orienter 188, for example, without changing the configuration of the rotation table 182. Thus, it is possible to prevent particles from being adhered to the wafer W in the transfer chamber 200 while reducing an increase in the manufacturing costs of the substrate processing apparatus 100.

Ninth Embodiment

Subsequently, a temperature control unit in accordance with a ninth embodiment of the present invention will be described with reference to FIG. 21. In the first to eighth embodiments, the temperature control unit that heats a wafer W in the cassette container 400 or orienter 180, just before the wafer W is loaded into a next chamber arranged immediately downstream from the cassette container 400 or orienter 180, namely, an associated one of the transfer chambers 200 to 205, has been described. However, the ninth embodiment employs the temperature control unit to heat a wafer W in the transfer chamber, just before the wafer W is loaded into a next chamber arranged immediately downstream from the transfer chamber, namely, the load-lock chamber 150. Hereinafter, this temperature control unit will be described.

Figure 21:
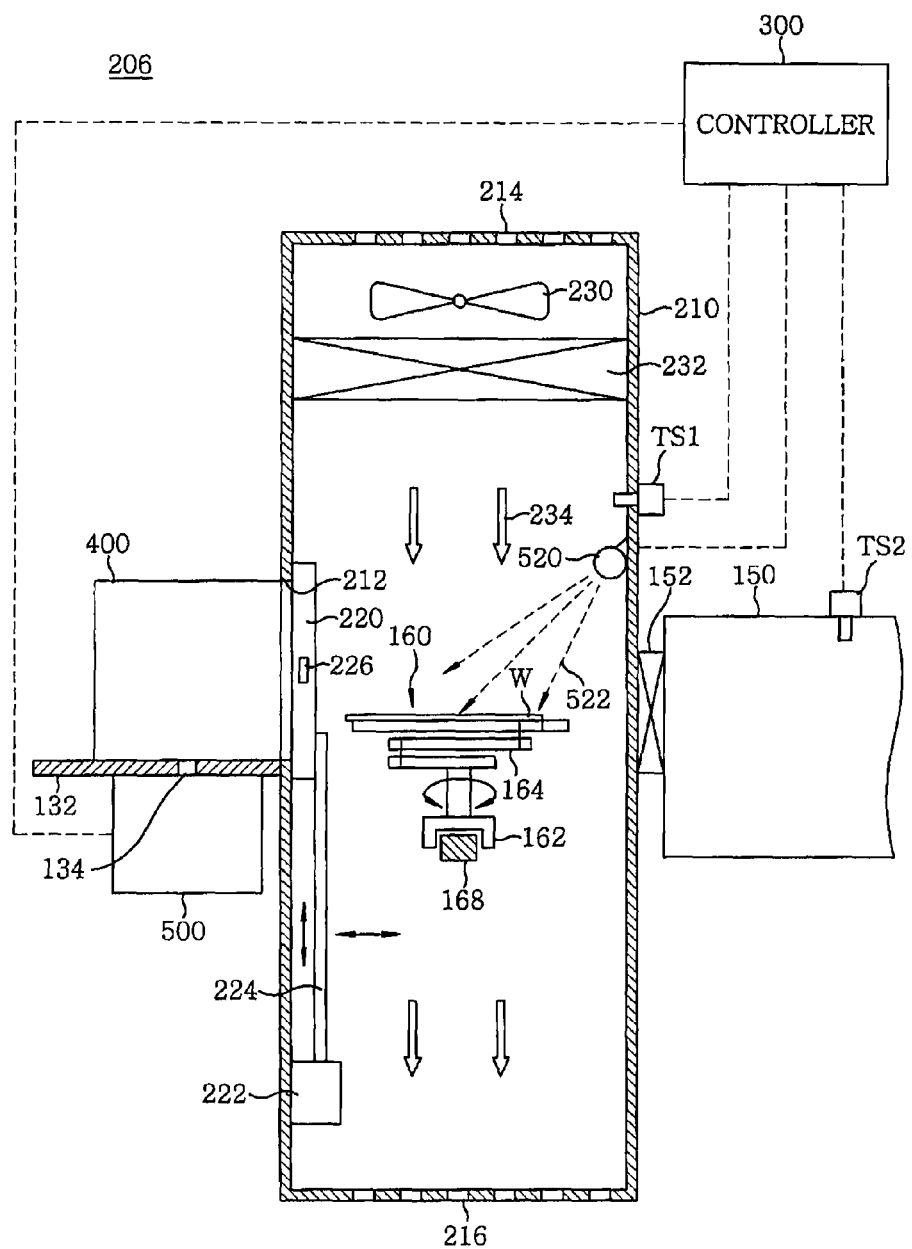
FIG. 21 is a longitudinal cross sectional view showing a schematic configuration of a transfer chamber including a temperature control unit in accordance with a ninth embodiment of the present invention.

FIG. 21 is a longitudinal cross sectional view showing a schematic configuration of the transfer chamber 206 in accordance with a ninth embodiment. As shown in FIG. 21, the transfer chamber 206 is additionally provided with a light irradiator 520, compared to the transfer chamber 200 in accordance with the first embodiment. In the ninth embodiment, a temperature sensor TS2 is also adhered to the load-lock chamber 150, to measure the internal temperature of the load-lock chamber 150, and to transmit the measured data to the controller 300.

The light irradiator 520 emits light 522 having a predetermined wavelength at a predetermined power level in accordance with a control signal transmitted from the controller 300. The light irradiator 520 is attached to an inner surface of one sidewall of the transfer chamber 206, to irradiate the light 522 to the surface of the wafer W held by the pick 166 of the transfer mechanism 160. A light source which irradiates, as the light 522, near infrared rays capable of being absorbed into the wafer W may be used as the light irradiator 520. The light irradiator 520, the temperature sensor TS2 and the controller 300 are included in the temperature control unit to adjust the temperature of the wafer W held by the pick 166 in accordance with the internal temperature of the load-lock chamber 150.

In accordance with the temperature control unit of the ninth embodiment, it is possible to heat the wafer W held by the pick 166 such that the temperature of the wafer W is higher than the internal temperature of the load-lock chamber 150 by a predetermined temperature (e.g., 3° C.) by irradiating the light 522 to the wafer W. Accordingly, it is possible to prevent particles from being adhered to the surface of the wafer W in a next chamber, namely, the load-lock chamber 150, after the wafer W is loaded into the load-lock chamber 150.

Further, in accordance with the ninth embodiment, it is possible to heat the wafer W simply by installing the light irradiator 520 in the housing of the transfer chamber 206, for example, without changing the configuration of the pick 166. Thus, it is possible to prevent particles from being adhered to the wafer W in the load-lock chamber 150 while reducing an increase in the manufacturing costs of the substrate processing apparatus 100.

Hereinafter, a temperature control unit in accordance with a tenth embodiment of the present invention will be described with reference to FIG. 22. The temperature control unit in accordance with the ninth embodiment functions to prevent particles from being adhered to a wafer W transferred from the transfer chamber 200 to the load-lock chamber 150. However, the tenth embodiment employs the temperature control unit to prevent particles from being adhered to a wafer W in the transfer chamber 200 after the wafer W is transferred (returned) from the load-lock chamber 150 to the transfer chamber 200.

Figure 22:
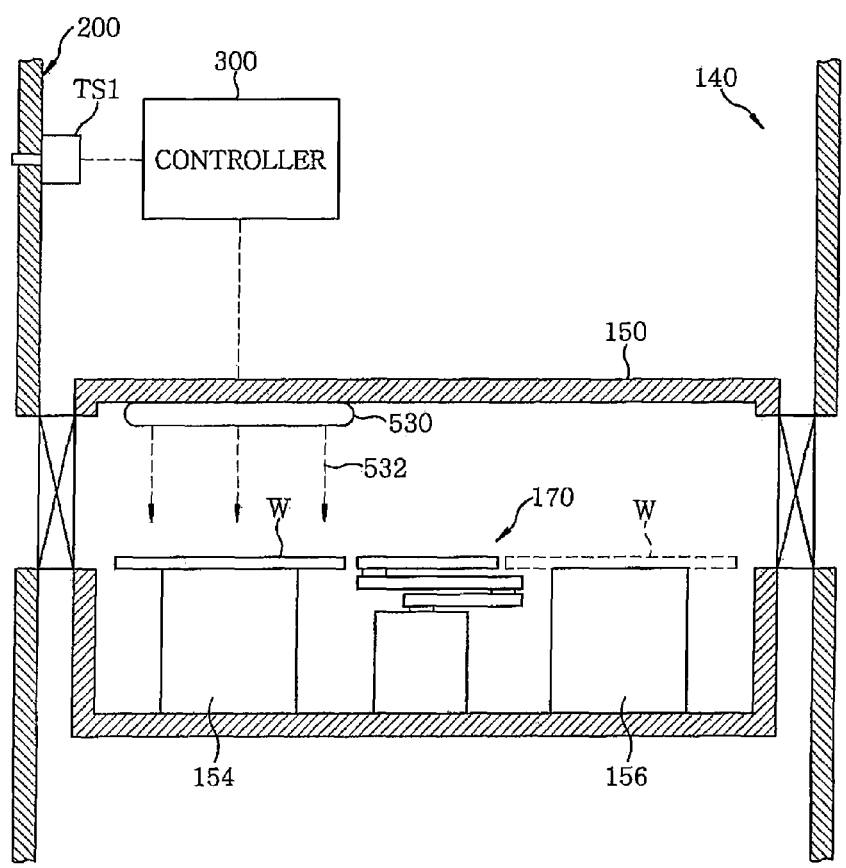
FIG. 22 is a longitudinal cross sectional view showing a schematic configuration of a load-lock chamber including a temperature control unit in accordance with a tenth embodiment of the present invention.

FIG. 22 is a longitudinal cross sectional view showing a schematic configuration of the load-lock chamber 150 in accordance with the tenth embodiment. As described with reference to FIG. 1, the load-lock chamber 150 includes a pair of buffer mounting tables 154 and 156 to temporarily hold wafers W in a standby state. An individual transfer mechanism 170 is arranged between the buffer mounting tables 154 and 156. Also, the load-lock chamber 150 is provided with a light irradiator 530. In addition to the components shown in FIG. 22, the load-lock chamber 150 is provided with, e.g., a means to adjust the internal pressure of the load-lock chamber 150. In FIG. 22, the pressure adjusting means is not shown.

The light irradiator 530 emits light 532 having a predetermined wavelength at a predetermined power level in accordance with a control signal transmitted from the controller 300. The light irradiator 530 is attached to, e.g., an inner surface of the ceiling portion of the housing of the load-lock chamber 150, to irradiate the light 532 to the surface of the wafer W placed on one of the buffer mounting tables 154 and 156 (e.g., the buffer mounting table 154). A light source which irradiates, as the light 532, near infrared rays capable of being absorbed into the wafer W may be used as the light irradiator 530. The light irradiator 530, the temperature sensor TS1 and the controller 300 are included in the temperature control unit to adjust the temperature of the wafer W placed on the buffer mounting table 154 in accordance with the internal temperature of a next chamber, namely, the transfer chamber 200.

In accordance with the temperature control unit of the tenth embodiment, it is possible to heat the wafer W placed on the buffer mounting table 154 in the load-lock chamber 150 such that the temperature of the wafer W is higher than the internal temperature of the transfer chamber 200 by a predetermined temperature (e.g., 3° C.) by irradiating the light 532 to the wafer W. Accordingly, it is possible to prevent particles from being adhered to the surface of the wafer W in a next chamber, namely, the transfer chamber 200, after the wafer W is loaded into the transfer chamber 200.

The temperature control unit in accordance with the tenth embodiment of the present invention has a configuration to heat a wafer W placed on the buffer mounting table 154 in the load-lock chamber 150 by irradiating the light 532 to the wafer W. However, it may be possible to heat the wafer W placed on the buffer mounting table 154, for example, by installing a heater in the buffer mounting table 154. By using this configuration, it is also possible to prevent particles from being adhered to the wafer W transferred from the load-lock chamber 150 to a next chamber, namely, the transfer chamber 200.

Substrate Processing Apparatus of Eleventh Embodiment

Figure 23:
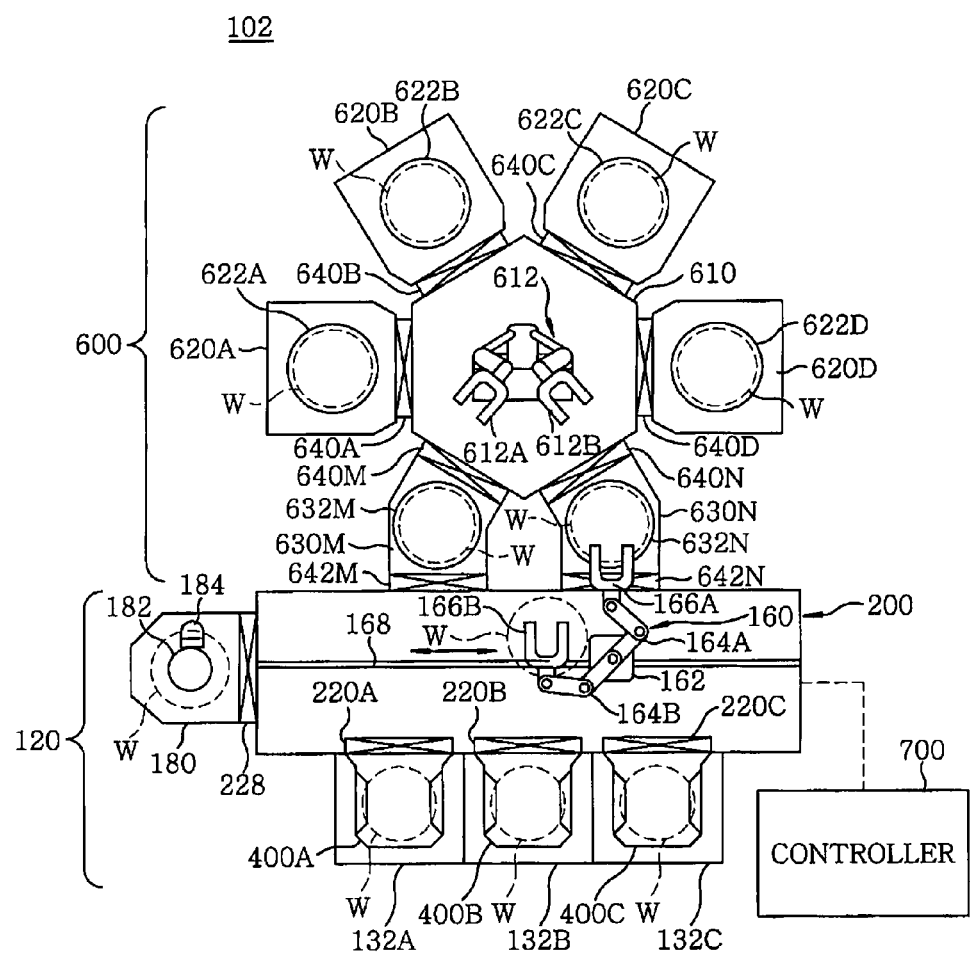
FIG. 23 is a cross sectional view showing a schematic configuration of a substrate processing apparatus in accordance with an eleventh embodiment of the present invention.

Hereinafter, a substrate processing apparatus 102 in accordance with an eleventh embodiment of the present invention will be described with reference to FIG. 23. FIG. 23 is a cross sectional view showing a schematic configuration of the substrate processing apparatus 102 in accordance with the eleventh embodiment. The substrate processing apparatus 102, which is of a cluster tool type, includes a vacuum processing unit 600 for performing various processes such as a film forming process and an etching process on a wafer W, a transfer unit for performing loading and unloading of the wafer W with respect to the vacuum processing unit 600, and a controller 700 for controlling the overall operation of the substrate processing apparatus 102. The basic functional configuration of the transfer unit included in the substrate processing apparatus 102 has many features in common with that of the transfer unit 120 included in the substrate processing apparatus 100 in accordance with the first embodiment. Accordingly, the transfer unit included in the substrate processing apparatus 102 and the components thereof will be designated by the same reference numerals as the transfer unit 120 and the components thereof, and a redundant description thereof will be omitted.

As shown in FIG. 23, the vacuum processing unit 600 includes a common transfer chamber 610 formed to have a polygonal (e.g., hexagonal) cross section, a plurality of processing chambers 620 (first to fourth processing chambers 620A to 620D) and first and second load-lock chambers 630M and 630N airtightly connected to the common transfer chamber 610.

The first to fourth processing chambers 620A to 620D are connected to the common transfer chamber 610 via gate valves 640A to 640D, respectively. The front ends of the first and second load-lock chambers 630M and 630N are connected to the common transfer chamber 610 via gate valves (vacuum side gate valves) 640M and 640N, respectively. The rear ends of the first and second load-lock chambers 630M and 630N are connected to the other side surface of the transfer chamber 200 via gate valves (atmosphere side gate valves) 642M and 642N, respectively.

The processing chambers 620A to 620D are provided therein with mounting tables (susceptors) 622A to 622D, respectively. In each of the processing chambers 620A to 620D, a desired process such as a film forming process (e.g., a plasma chemical vapor deposition (CVD) process) or an etching process (e.g., a plasma etching process) is performed on the wafer W placed on the mounting table. Further, the processing chambers 620A to 620D are connected to a gas supply system (not shown) to supply process gas, purge gas, or the like to the interiors of the processing chambers 620A to 620D, and a gas exhaust system (not shown) to evacuate the interiors of the processing chambers 620A to 620D. The number of processing chambers 620 is not limited to the case illustrated in FIG. 23.

Each of the first and second load-lock chambers 630M and 630N has a function to transfer a wafer W to a next stage after executing pressure adjustment in a state of temporarily maintaining the wafer W. The first and second load-lock chambers 630M and 630N are provided therein with delivery tables 632M and 632N capable of holding wafers W, respectively.

In the common transfer chamber 610, a processing unit side transfer mechanism 612 is provided. The processing unit side transfer mechanism 612 has a so-called double arm structure including two arms. Each arm of the processing unit side transfer mechanism 612 has a multi-joint arm structure capable of performing bending, elevation, and rotation. Picks 612A and 612B are provided at respective front ends of the arms. The processing unit side transfer mechanism 612 as described above may handle two wafers W at the same time, and may transfer a wafer W among the load-lock chambers 630M and 630N and the processing chambers 620A to 620D. Each of the picks 612A and 612B of the processing unit side transfer mechanism 612 includes a sensor (not shown) to detect whether or not the corresponding pick 612A or 612B holds a wafer W. The number of arms in the processing unit side transfer mechanism 612 is not limited to the above-described number. For example, the processing unit side transfer mechanism 612 may be a single arm mechanism having only one arm.

The controller 700 executes a certain program, based on predetermined information, to control each unit of the apparatus 102. In accordance with this control operation, for example, processes in the processing chambers 620A to 620D, wafer transfer in the transfer chamber 200 and common transfer chamber 610, and position alignment in the orienter 180 are executed. The controller 700 also controls a temperature control unit which will be described later.

Temperature Control Unit of Eleventh Embodiment

Next, an exemplary configuration of the temperature control unit in accordance with the eleventh embodiment will be described with reference to FIG. 24. The temperature control unit in accordance with the eleventh embodiment functions to prevent particles from being adhered to wafers W in the transfer chamber 200 after the wafers W are transferred (returned) from the first and second load-lock chambers 630M and 630N to the transfer chamber 200.

Figure 24:
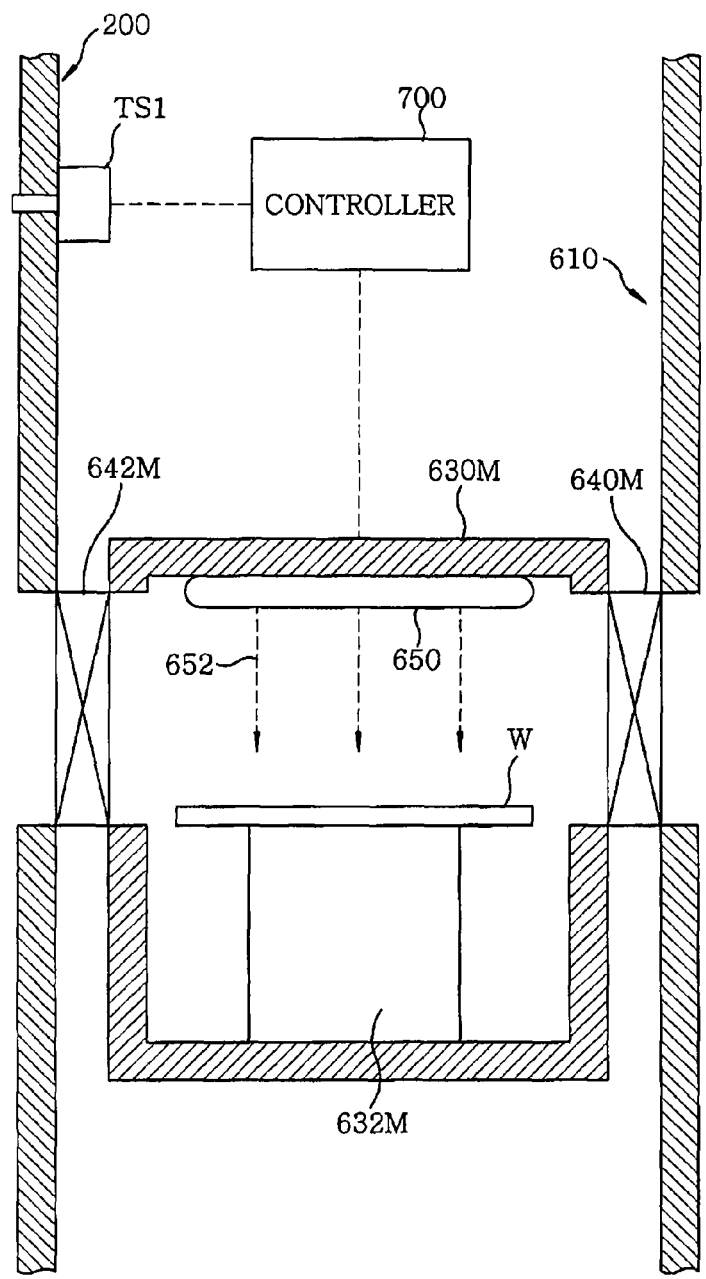
FIG. 24 is a longitudinal cross sectional view showing a schematic configuration of a load-lock chamber including a temperature control unit in accordance with the eleventh embodiment of the present invention.

FIG. 24 is a longitudinal cross sectional view showing schematic configurations of the first and second load-lock chambers 630M and 630N in accordance with the eleventh embodiment. In this embodiment, the first and second load-lock chambers 630M and 630N have substantially a same configuration. In FIG. 24, only the first load-lock chamber 630M is representatively illustrated.

As described with reference to FIG. 23, the first load-lock chamber 630M includes the delivery table 632M to temporarily hold a wafer W in a standby state, and a light irradiator 650. In the eleventh embodiment, a temperature sensor TS1 may also be attached to the transfer chamber 200, to measure the internal temperature of the transfer chamber 200, and to transmit the measured data to the controller 700. In addition to the components shown in FIG. 24, the first load-lock chamber 630M includes, e.g., a means to adjust the internal pressure of the first load-lock chamber 630M. This pressure adjusting means is not shown.

The light irradiator 650 emits light 652 having a predetermined wavelength at a predetermined power level in accordance with a control signal transmitted from the controller 700. The light irradiator 650 is attached to, e.g., an inner top surface of a housing of the first load-lock chamber 630M, to irradiate the light 652 to the surface of the wafer W placed on the delivery table 632M. A light source which irradiates, as the light 652, near infrared rays capable of being absorbed into the wafer W may be used as the light irradiator 650. The light irradiator 650, the temperature sensor TS1 and the controller 700 are included in the temperature control unit to adjust the temperature of the wafer W placed on the delivery table 632M in accordance with the internal temperature of a next chamber, namely, the transfer chamber 200.

In accordance with the temperature control unit of the eleventh embodiment, it is possible to heat the wafer W placed on the delivery table 632M in the first load-lock chamber 630M such that the temperature of the wafer W becomes higher than the internal temperature of the transfer chamber 200 by a predetermined temperature (e.g., 3° C.) by irradiating the light 652 to the wafer W. Accordingly, it is possible to prevent particles from being adhered to the surface of the wafer W in a next chamber, namely, the transfer chamber 200, after the wafer W is loaded into the transfer chamber 200.

The temperature control unit in accordance with the eleventh embodiment of the present invention has a configuration to heat a wafer W placed on the delivery table 632M in the first load-lock chamber 630M by irradiating the light 652 to the wafer W. However, it may be possible to heat the wafer W placed on the delivery table 632M, for example, by installing a heater at the delivery table 632M. By using this configuration, it is also possible to prevent particles from being adhered to the wafer W transferred from the first load-lock chamber 630M to a next chamber, namely, the transfer chamber 200.

Although the case in which a wafer W is transferred from the first load-lock chamber 630M to the transfer chamber 200 has been described in this embodiment, it is also possible to prevent adhesion of particles to the wafer W in the case in which the wafer W is transferred from the second load-lock chamber 630N to the transfer chamber 200.

As described above, in accordance with the first to ninth embodiments, it is possible to prevent particles from being adhered to unprocessed wafers W in a next chamber arranged at downstream from the cassette containers 400 (400A to 400C), in which the wafers W were contained, during the transfer of the wafers W to the load-lock chambers 150 (150A and 150B) or 630 (630M and 630N). That is, it is possible to transfer clean wafers W to the load-lock chambers 150 or 630.

In accordance with the tenth or eleventh embodiment, it is also possible to prevent adhesion of particles to processed wafers W during the transfer of the wafers W from the load-lock chambers 150 or 630 to the cassette containers 400.

It is also possible to prevent adhesion of particles to wafers W from the cassette containers 400 to the load-lock chambers 150 or 630, i.e., throughout the substrate processing apparatus 100 or 102, by appropriately combining the first to eleventh embodiments. In particular, the first to eleventh embodiments may be selectively combined in accordance with the particle generation state in each chamber of the substrate processing apparatus 100 or 102.

Although the prevention of adhesion of particles to unprocessed wafers W during the transfer of the wafers W from the cassette container 400 containing the wafers W to the load-lock chambers 150 or 630 has been described in the first to ninth embodiments, there is no limitation on the transfer direction of the wafers W in each embodiment. For example, the above-described embodiments are applicable to the case in which processed wafers W are returned from the load-lock chambers 150 or 630 to the cassette containers 400. In this case, a positional relationship between a chamber where a wafer W is currently present and a next chamber for prevention of particle adhesion is opposite to that of the first to ninth embodiments.

Referring to the test results shown in FIG. 8 concerning the relationship between the temperature of a wafer W and the amount of particles adhered to the surface of the wafer W, it can be seen that the amount of particles adhered to the surface of the wafer W decreases as the difference between the temperature of the wafer W and the internal temperature of the transfer chamber 200 increases. Although FIG. 8 shows the test results in the case in which particles have a size of 0.06 μm or more, it can be inferred that the amount of particles adhered to the surface of the wafer W is reduced by the temperature gradient of an atmosphere in the vicinity of the surface of the wafer W even when the particles have a size of 0.06 μm or less.

It is difficult to detect the particle adhesion amount for a particle size of 0.06 in or less due to the accuracy of the testing device. However, it is possible to derive the relationship between the temperature of the wafer W and the amount of particles adhered to the surface of the wafer W by using an equation taking into consideration of forces (e.g., gravity, electrostatic force, thermophoretic force and the like) exerted on particles in the vicinity of the surface of the wafer W.

Figure 25:
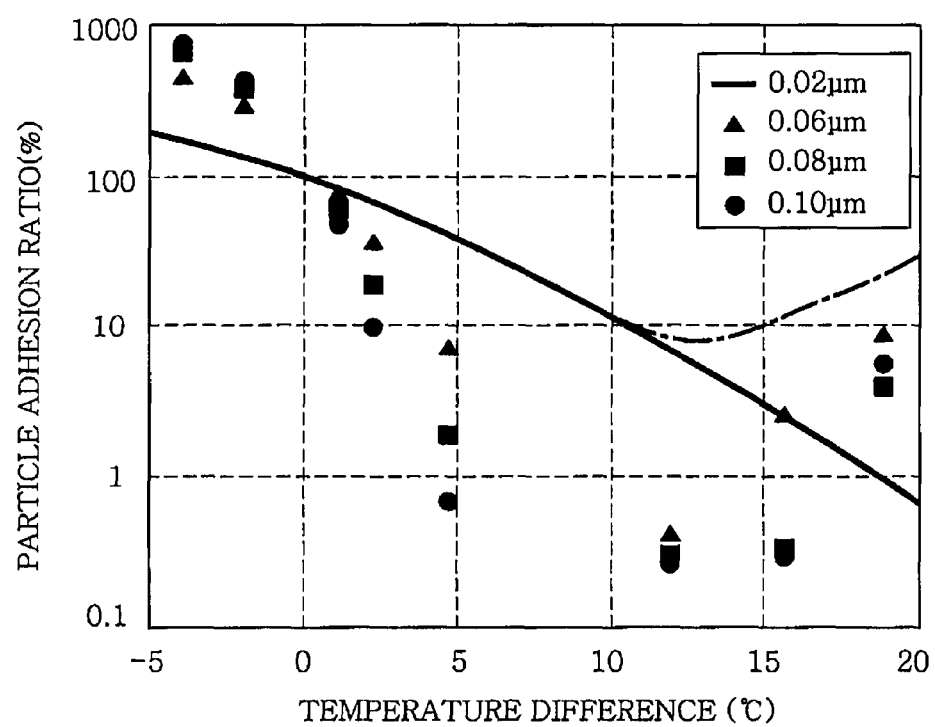
FIG. 25 is a view obtained by adding a graph depicting calculation results for a particle size of 0.02 µm to a graph of FIG. 8.

FIG. 25 illustrates a graph showing results obtained by calculating a particle adhesion rate in the case in which the size of particles is, e.g., 0.02 μm. FIG. 25 is obtained by overlapping a solid line graph for the particle size of 0.02 μm and the graph of FIG. 8.

Referring to FIG. 25, it can be seen that even when the particle size is 0.02 μm, the amount of particles adhered to the surface of the wafer W decreases as the difference between the temperature of the wafer W and the internal temperature of the transfer chamber 200 increases, in the same way as when the particle size is 0.06 μm or more. Referring to the solid line graph of FIG. 25, the adhesion amount of particles is reduced when the difference between the temperature of the wafer W and the room temperature ranges from 0° C. to +12° C. Based on the results of calculation, the adhesion amount of particles is expected to be further reduced when the temperature difference exceeds +12° C. Accordingly, it may be possible to further reduce the adhesion amount of particles when the temperature difference exceeds +12° C.

Figure 26:
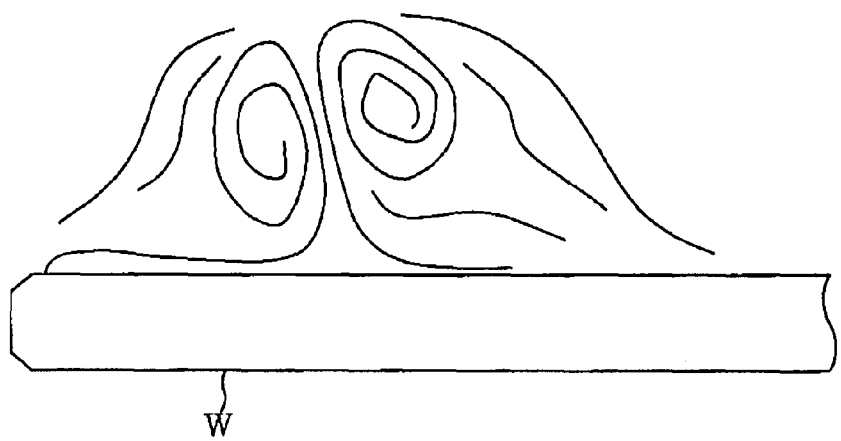
FIG. 26 schematically illustrates a turbulent flow generation condition.

In actual cases, however, it can also be seen that, when the difference between the internal temperature of the transfer chamber 200 and the temperature of the wafer W exceeds +12° C., natural convection develops on the surface of the wafer W. The natural convection is increased as the temperature difference increases. The natural convection develops in an ascending direction from the surface (the surface to be processed) of the wafer W. Accordingly, if a forced air flow, e.g., a downflow 234 formed in the transfer chamber 200 as shown in FIG. 2, is generated in a direction opposite to the natural convection on the surface, to be processed, of the wafer W, turbulent flows such as plumes may be generated at several positions on the surface, to be processed, of the wafer W, as shown in FIG. 26. When such turbulent flows are generated, particles may be easily adhered to the surface, to be processed, of the wafer W. In this case, the effect of preventing particle adhesion by a repulsive force such as a thermophoretic force caused by a temperature gradient may be not sufficient enough.

Accordingly, it may be inferred that, in actual cases, the amount of particles adhered to the surface of the wafer W tends to increase in a temperature difference range exceeding +12° C., even though the increase is slight, as indicated by a dashed double-dotted line in FIG. 25. Further, such a phenomenon may occur, not only for a particle size of 0.02 μm, but also for a particle size of 0.06 μm or less and even for a particle size of 0.06 μm or more. That is, it may be inferred that the increase in the particle adhesion rate occurring in the temperature difference range exceeding +12° C., even though it is slight, as in the test results of FIG. 8, is caused by turbulent flows generated on the surface, to be processed, of the wafer W.

The particles may be more easily influenced by such a turbulent flow as the size of the particles decreases. Accordingly, particles having a very small size may be easily adhered to the surface of the wafer W, even though the adhesion amount thereof is slight. Therefore, in order to achieve an enhancement in the effect of preventing adhesion of particles having a very small size of 0.06 μm or less, it may be desirable to prevent a turbulent flow from being generated on the surface, to be processed, of the wafer W even when the difference between the internal temperature of the transfer chamber 200 and the temperature of the wafer W exceeds +12° C. Hereinafter, a substrate processing apparatus configured to prevent generation of a turbulent flow on the surface, to be processed, of the wafer W will be described.

Twelfth Embodiment

Figure 27:
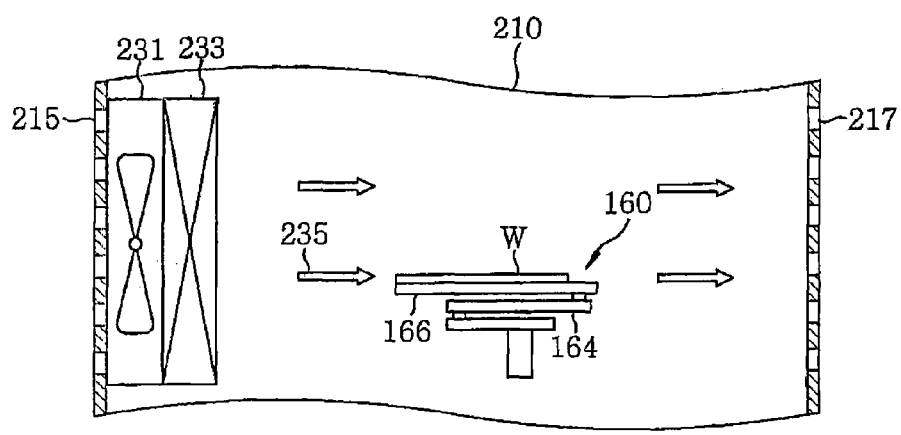
FIG. 27 schematically illustrates a configuration of a transfer chamber in accordance with a twelfth embodiment of the present invention.

Now, a twelfth embodiment of the present invention will be described with reference to FIG. 12. In this embodiment, a concrete example capable of preventing a turbulent flow from being generated on a surface to be processed of a wafer W by forming a flow of gas along the surface of the wafer W during transfer of the wafer W will be given. FIG. 27 illustrates a schematic configuration of a transfer chamber 207 in accordance with the twelfth embodiment. FIG. 27 is a partial cross sectional view of an area where the transfer mechanism 160 is horizontally movable.

The transfer chamber 207 shown in FIG. 27 is provided with a flow forming means to forcibly form a flow of gas along a surface, to be processed, of a wafer W held by the transfer mechanism 160. As shown in FIG. 27, the flow forming means is configured as, e.g., a side flow forming means to form a side flow 235 directed from one sidewall to the other sidewall in the transfer chamber 207.

Hereinafter, a specific configuration of the side flow forming means will be described. A plurality of air supply holes 215 are formed at one of facing sidewalls of the housing 210. A plurality of air discharge holes 217 are formed at the other sidewall of the housing 210. An air supply fan 231 is arranged at the inside of the air supply holes 215, to introduce exterior air to the interior of the transfer chamber 207. An air filter 233 is arranged at the inside of the air supply fan 231, to filter the exterior air introduced by the air supply fan 231. The sidewall of the housing 210, at which the side flow forming means is provided, may be a sidewall corresponding to a short side of a substantially rectangular cross section of the transfer chamber 207 or a sidewall corresponding to a long side of the substantially rectangular cross section of the transfer chamber 207.

The transfer chamber 207 shown in FIG. 27 includes the side flow forming means, instead of the air supply holes 214, the air discharge holes 216, the air supply fan 230, and the air filter 232 included in the downflow forming means of the transfer chamber 200 shown in FIG. 2. The remaining configuration is similar to that of the transfer chamber 200 shown in FIG. 2 and, thus, a detailed description thereof will be omitted.

In accordance with the twelfth embodiment having the above-described configuration, a wafer W heated by the hot air 502 supplied to the cassette container 400 accommodating the wafer W is taken out of the cassette container 400 by using the transfer mechanism 161, and then transferred to the load-lock chamber 150 via the transfer chamber 207. While the transfer mechanism 160 moves horizontally while holding the wafer W, the side flow 235 is always formed along the surface, to be processed, of the wafer W by the side flow forming means in accordance with this embodiment.

Thus, even if an ascending air flow is generated on the surface, to be processed, of the wafer W due to natural convection occurring when the difference between the internal temperature of the transfer chamber 207 and the temperature of the wafer W exceeds +12° C., it is possible to transfer the wafer W under a condition that the side flow 235 does not face the ascending air flow in opposite directions. Accordingly, it is possible to prevent a turbulent flow from being generated on the surface, to be processed, of the wafer W.

Therefore, by forming a flow of air, namely, the side flow 235, along the surface, to be processed, of the wafer W in at least an area where the transfer mechanism 160 is horizontally movable, as in the twelfth embodiment, it is possible to prevent a turbulent flow from being generated on the surface of the wafer W even when the temperature of the wafer W is adjusted such that the difference between the temperature of the wafer W and the internal temperature of the transfer chamber 207 is higher than +12° C. Accordingly, the adhesion of particles may be effective even while the temperature of the wafer W is adjusted such that the temperature difference is, e.g., 12° C. to 20° C.

As a result, the effect of preventing adhesion of particles having a very small size of 0.06 μm or less may be further enhanced, as shown in the solid line graph of FIG. 25. Even for a particle size of 0.06 μm or more, the particle adhesion prevention effect may be further enhanced. Thus, the particle adhesion prevention effect may be further enhanced irrespective of the size of particles. In particular, when it is desired to more securely prevent particles having a very small size less than 0.06 μm from being adhered to the wafer W, it may be effective to again form a flow in the transfer chamber 207.

While the preferred embodiments of the present invention have been described with reference to the accompanying drawings, the present invention is not limited thereto. It will be understood by those skilled in the art that various changes and modifications may be made within the category as defined in the following claims, and those are within the technical scope of the present invention.

In detail, although the first to eleventh embodiments have been described in conjunction with the case in which the present invention is applied to the substrate processing apparatus 100 or 102 having a configuration shown in FIG. 1 or 23, the present invention is not limited thereto. The present invention is applicable to various substrate processing apparatuses, in addition to the substrate processing apparatuses 100 and 102 in accordance with the first to eleventh embodiments. For example, the present invention is applicable to a vertical heat treating apparatus, a coating and developing apparatus or the like.

What is claimed is:

1. A substrate processing apparatus comprising:
    a transfer chamber that performs delivery of a substrate to and from a substrate accommodating container, in which the substrate is accommodated, via a gate at which the substrate accommodating container is set;
    a processing chamber that performs a specific process on the substrate;
    a load-lock chamber that connects the processing chamber with the transfer chamber; and
    a temperature control unit that adjusts a temperature of the substrate such that the temperature of the substrate just before the substrate is loaded into a selected one of the transfer chamber and the load-lock chamber is maintained to be higher than an internal temperature of the selected chamber,
    wherein the temperature control unit includes a hot air supplier to adjust the temperature of the substrate by supplying, to an interior of the substrate accommodating container, hot air adjusted to have a temperature higher than the internal temperature of the selected chamber, wherein the transfer chamber has an air passage formed in the transfer chamber to guide the hot air to the gate, and the hot air supplier supplies the hot air to the interior of the substrate accommodating container via the air passage and the gate, wherein the air passage is defined between a sidewall of the transfer chamber and a partition wall provided in the transfer chamber and the partition wall has an opening, wherein a door is provided at the gate to open or close the gate and the air passage is isolated from an atmosphere of the transfer chamber by closing the opening with the door at least during the supplying of the hot air via the air passage and the gate, and wherein the gate and the opening are configured such that the substrate is transferred between the substrate accommodating container and the transfer chamber via the gate and the opening.

2. The substrate processing apparatus of claim 1, wherein the temperature control unit includes a first light irradiator installed in the transfer chamber to adjust the temperature of the substrate by irradiating first light having a first predetermined wavelength to the substrate such that the temperature of the substrate just before the substrate is transferred from the transfer chamber to the load-lock chamber is maintained to be higher than the internal temperature of the load-lock chamber.

3. The substrate processing apparatus of claim 2, wherein the temperature control unit includes a second light irradiator installed in the load-lock chamber to adjust the temperature of the substrate by irradiating second light having a second predetermined wavelength to the substrate such that the temperature of the substrate just before the substrate is transferred from the load-lock chamber to the transfer chamber is maintained to be higher than the internal temperature of the transfer chamber.

4. The substrate processing apparatus of claim 2, wherein the first light is a near infrared ray.

5. The substrate processing apparatus of claim 3, wherein the second light is a near infrared ray.

6. The substrate processing apparatus of claim 1, wherein the temperature control unit adjusts the temperature of the substrate such that the temperature of the substrate just before the substrate is loaded into the selected chamber is maintained to be higher than the internal temperature of the selected chamber by 2 to 12° C.

7. The substrate processing apparatus of claim 6, wherein the selected chamber, into which the substrate will be loaded, has an internal pressure of 200 Torr or more.

8. The substrate processing apparatus of claim 6, wherein the selected chamber, into which the substrate will be loaded, has an internal pressure of 300 Torr or more.

9. The substrate processing apparatus of claim 1, wherein the sidewall of the transfer chamber is spaced apart from the partition wall and the air passage is provided between the sidewall and the partition wall.

10. The substrate processing apparatus of claim 1, wherein the partition wall is provided between the sidewall of the transfer chamber and a transfer mechanism provided in the transfer chamber to transfer the substrate.

11. A substrate processing apparatus, which includes a substrate accommodating container, in which a substrate to be processed is accommodated and which is set at a gate, loads the substrate from the substrate accommodating container into a transfer chamber via the gate, and performs a specific process on the substrate, comprising:

a temperature control unit to adjust a temperature of the substrate such that the temperature of the substrate just before the substrate is loaded from the substrate accommodating container into the transfer chamber is maintained to be higher than an internal temperature of the transfer chamber, wherein the temperature control unit includes a hot air supplier to adjust the temperature of the substrate by supplying, to an interior of the substrate accommodating container, hot air adjusted to have a temperature higher than the internal temperature of the transfer chamber, wherein the transfer chamber has an air passage formed in the transfer chamber to guide the hot air to the gate, and the hot air supplier supplies the hot air to the interior of the substrate accommodating container via the air passage and the gate, wherein the air passage is defined between a sidewall of the transfer chamber and a partition wall provided in the transfer chamber and the partition wall has an opening, wherein a door is provided at the gate to open or close the gate and the air passage is isolated from an atmosphere of the transfer chamber by closing the opening at least during the supplying of the hot air via the air passage and the gate, and wherein the gate and the opening are configured such that the substrate is transferred between the substrate accommodating container and the transfer chamber via the gate and the opening.

12. The substrate processing apparatus of claim 11, wherein:

the transfer chamber has a plurality of gates, at each gate a corresponding substrate accommodating container being set; and the air passage is provided for each of the gates.

13. The substrate processing apparatus of claim 11, wherein:

the transfer chamber includes a transfer unit having a substrate holder to hold the substrate; and the temperature control unit includes a heater to heat the substrate when the substrate holder holds the substrate after being inserted into the substrate accommodating container, to take the substrate out of the substrate accommodating container.

14. The substrate processing apparatus of claim 11, wherein the sidewall of the transfer chamber is spaced apart from the partition wall and the air passage is provided between the sidewall and the partition wall.

15. The substrate processing apparatus of claim 11, wherein the partition wall is provided between the sidewall of the transfer chamber and a transfer mechanism provided in the transfer chamber to transfer the substrate.

* * * * *